United States Patent [19]

McClure et al.

[11] Patent Number: 5,257,229

[45] Date of Patent: Oct. 26, 1993

[54] COLUMN REDUNDANCY ARCHITECTURE FOR A READ/WRITE MEMORY

[75] Inventors: David C. McClure, Carrollton; Narasimhan Iyengar, Plano, both of Tex.

[73] Assignee: SGS-Thomson Microelectronics, Inc., Carrollton, Tex.

[21] Appl. No.: 830,314

[22] Filed: Jan. 31, 1992

[51] Int. Cl.$^5$ .............................................. G11C 7/00
[52] U.S. Cl. .................... 365/200; 365/225.7; 365/230.02; 365/230.06; 307/449; 307/463
[58] Field of Search ............... 365/200, 225.7, 230.02, 365/230.06; 307/449, 463

[56] References Cited

U.S. PATENT DOCUMENTS

| | | | |
|---|---|---|---|
| 4,573,146 | 2/1986 | Graham et al. | 365/200 |
| 4,656,610 | 4/1987 | Yoshida et al. | 365/200 X |
| 5,124,948 | 6/1992 | Takizawa et al. | 365/200 |
| 5,146,429 | 9/1992 | Kawai et al. | 365/200 |
| 5,177,743 | 1/1993 | Shimoda et al. | 365/200 X |
| 5,195,057 | 3/1993 | Kasa et al. | 365/200 |

OTHER PUBLICATIONS

Hardee, et al., "A Fault-Tolerant 20 ns/375 mW 16K×1 NMOS Static Ram", *J. Solid State Circuits,* vol. SC-16, No. 5 (IEEE, 1981), pp. 435-443.
Childs, et al., "An 18 ns 4K×4 CMOS SRAM", *J. Solid State Circuits,* vol. SC-19, No. 5 (IEEE, 1984), pp. 545-551.
Sakurai, et al., "A Low Power 46 ns 256 kbit CMOS Static RAM with Dynamic Double Word Line", *IEEE J. Solid State Circuits,* vol. SC-19, No. 5 (IEEE, Oct. 1984) pp. 578-585.

*Primary Examiner*—Eugene R. LaRoche
*Assistant Examiner*—Do Hyum Yoo
*Attorney, Agent, or Firm*—Rodney M. Anderson; Lisa K. Jorgenson; Richard K. Robinson

[57] ABSTRACT

An integrated circuit memory is disclosed which has its primary memory array arranged into blocks and which has redundant columns, each of which can replace a column in any one of the blocks. The redundant columns are selected by way of a redundant column decoder, associated with each column. A plurality of redundant sense amplifiers are each associated with selected redundant columns. Each of the redundant column decoders includes a set of fuses for storing the column address responsive to which its associated redundant column is to be selected. The coupling of each redundant sense amplifier is controlled by a redundant multiplexer associated with each of the input/output terminals. Each redundant multiplexer receives the redundant column select signals from each redundant column decoder corresponding thereto, and includes fuses which indicate if its input/output terminal is to be placed in communication with its associated sense amplifier upon selection of a redundant column.

20 Claims, 7 Drawing Sheets

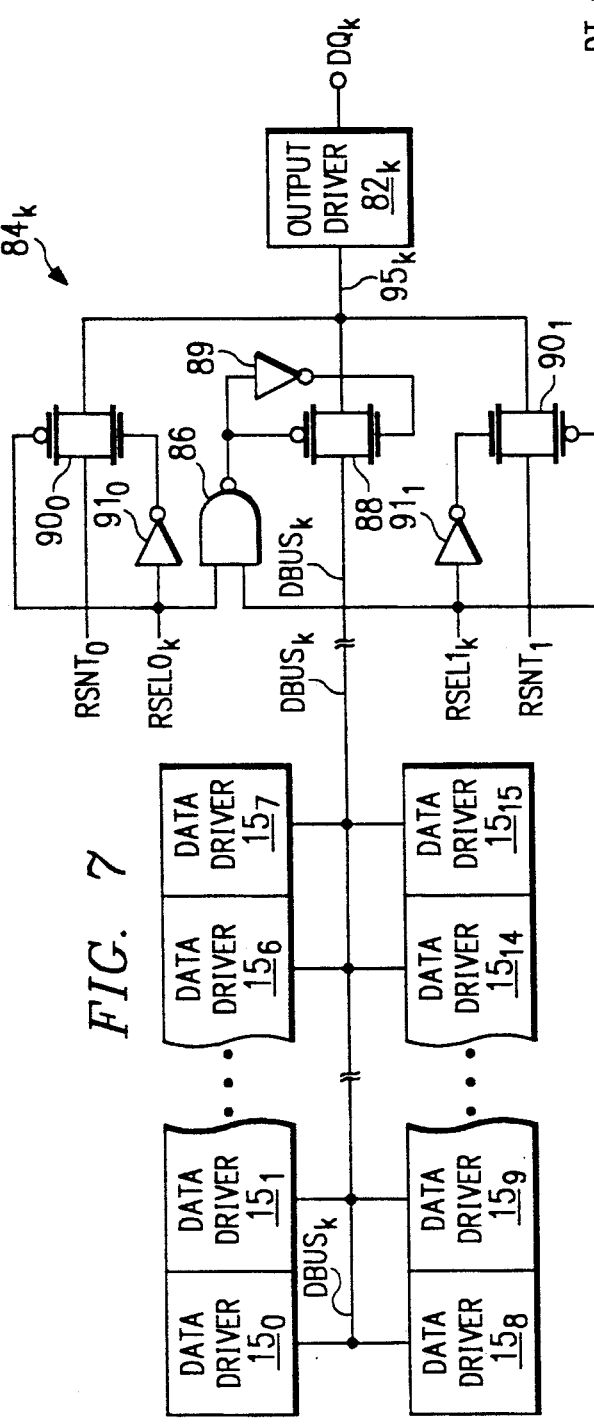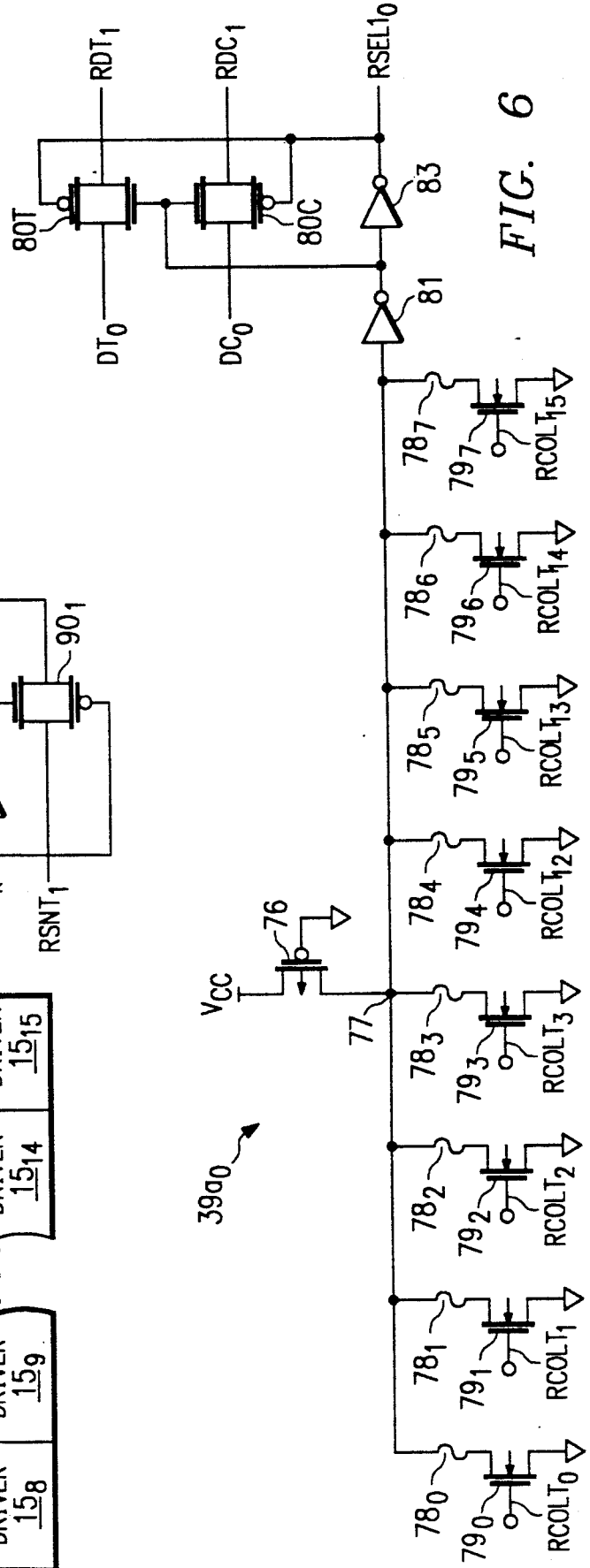

COLUMN REDUNDANCY ARCHITECTURE FOR A READ/WRITE MEMORY

This application is related to copending applications Ser. No. 830,315, Ser. No. 830,131, and Ser. No. 830,237, each of which is filed contemporaneously herewith, and each of which is assigned to SGS-Thomson Microelectronics, Inc.

This invention is in the field of integrated circuits containing memory arrays, and is more particularly directed to redundancy schemes in such circuits.

BACKGROUND OF THE INVENTION

Modern memory integrated circuits, particularly read/write circuits such as static random access memories (SRAMS) and dynamic random access memories (DRAMs), are becoming quite large in physical size and in the density of memory locations therein. For example, SRAMs with $2\times 2^{20}$ addressable locations and DRAMs with $2^{22}$ addressable locations are now readily available. Even with submicron feature sizes, the physical size of the integrated circuit chip containing such memories can be as large as on the order of 180 kmil$^2$. In addition, many complex microprocessors now include significant amounts of on-chip memory, such as 64 kbytes or more of read-only memory and 64 kbytes or more of random access memory. The physical chip size of some of these modern microprocessors may be as large as on the order of 250 kmil$^2$.

It is well known that as the minimum feature size in integrated circuit chips becomes smaller, the size of defect that can cause a failure (i.e., the size of a "killing" defect) also shrinks. As a result, especially with large chip sizes, it is more difficult to achieve adequate manufacturing yield as the size of a killing defect reduces. In order to reduce the vulnerability of a relatively large integrated circuit chip to a single small defect, modern integrated circuits utilize spare rows and columns that can be used to replace defective rows and columns, respectively, in the memory portion of the circuit. Substitution of one of the spare rows or columns is conventionally accomplished by the opening of fuses (or closing of antifuses, as the case may be) in decoder circuitry, so that access is made to the spare row or column upon receipt of the address for the defective row or column in the primary memory array. Conventional fuses include polysilicon fuses which can be opened by a laser beam, and also avalanche-type fuses and antifuses.

Examples of memory devices incorporating conventional redundancy schemes are described in Hardee, et al., "A Fault-Tolerant 30 ns/375 mW 16K×1 NMOS Static RAM", *J. solid State Circuits*, Vol. SC-16, No. 5 (IEEE, 1981), pp. 435–43, and in Childs, et al., "An 18 ns 4K×4 CMOS SRAM", *J. Solid State Circuits*, Vol. SC-19, No. 5 (IEEE, 1984), pp. 545–51. An example of a conventional redundancy decoder is described in U.S. Pat. No. 4,573,146, issued Feb. 25, 1986, assigned to SGS-Thomson Microelectronics, Inc., and incorporated herein by this reference.

Of course, these spare rows and columns require additional chip area for their implementation. Indeed, it has been observed that provision of too many spare rows and columns can add, rather than save, manufacturing cost, if the cost of the chip area required for the spare elements and their decoders outweighs the yield improvement achieved by use of the spare elements. Accordingly, the number of spare rows and columns must be selected considering expected defect density. Besides selection of the number of spare elements, effective redundancy schemes must consider the type of defects likely to be encountered, so that the spare elements match the expected failure type and manifestation.

As can be expected, the organization of the memory array is also a large factor in selecting the number of spare elements to be implemented. For purposes of power reduction, many high density memories are now organized into sub-arrays, or blocks, so that only a portion of the memory need be energized in a given access, resulting in significant power reduction. Power dissipation is of especially high concern for integrated circuit memories intended for use in applications, such as portable computers, which are powered from batteries. Copending application Ser. No. 588,600, filed Sept. 26, 1990, assigned to SGS-Thomson Microelectronics, Inc., and incorporated herein by this reference, describes a memory having such a partitioned array.

While such partitioned memories provide significant, and in some cases essential, power reduction, the organization of the primary memory into sub-arrays makes more costly the assignment of spare elements, particularly redundant columns. As the number of sub-arrays or blocks increases, for example up to sixteen or thirty-two blocks, the chip area cost of providing spare columns for each becomes quite high. As a result, fewer columns may be provided per block, which of course reduces the numbers of defects which can be "repaired" by use of the spare columns.

Further exacerbating the difficulty of efficiently providing redundant columns is the common use of multiple input/output terminals in modern RAMS. many RAms provide eight or sixteen simultaneous outputs; for example, the memory of the above-noted copending application Ser. No. 588,600 accesses eight bits (all in the same block) with each memory address. Assignment of one column per input/output per block can greatly increase the chip area required, while only assigning one column per input/output per block can limit the repairability yield (i.e., the fraction of memories built which can be saved by use of the spare columns).

It is therefore an object of the present invention to provide an integrated circuit having a memory column redundancy architecture which can map a redundant column into multiple block addresses.

It is another object of the present invention to provide such a circuit in which a redundant column can be mapped to one of several input/output terminals.

It is another object of the present invention to provide such a circuit in which the programming of the address assignment of the redundant columns is relatively simple.

It is another object of the present invention to provide such a circuit in which the performance loss in accessing a redundant column is minimized or eliminated.

Other objects and advantages of the present invention will be apparent to those of ordinary skill in the art having reference to the following specification together with the drawings.

SUMMARY OF THE INVENTION

The invention may be incorporated into a memory integrated circuit having redundant columns by providing a block of redundant columns associated with each row; each of the columns can be assigned to a different column address, regardless of input/output terminal assignment and regardless of block address. Each redundant column is associated with a redundant column decoder, having a block select portion and a column select portion. Multiple redundant sense amplifiers are provided, so that multiple redundant columns can be accessed with the same address, mapped to different input/output terminals. Fuse-programmable multiplexing circuitry is provided so that each redundant column can be mapped to any one of the multiple input/output terminals. Each redundant sense amplifier can map to any one of the input/output terminals, depending upon the redundant column selected.

BRIEF DESCRIPTION OF THE DRAWINGS

FIG. 6 is an electrical diagram, in schematic form, of one of the redundant input/output multiplexers in the architecture of FIG. 2.

FIG. 7 is an electrical diagram, in schematic form, of one of the final data multiplexers in the memory of FIG. 1.

DETAILED DESCRIPTION OF THE PREFERRED EMBODIMENT

Figure 1:
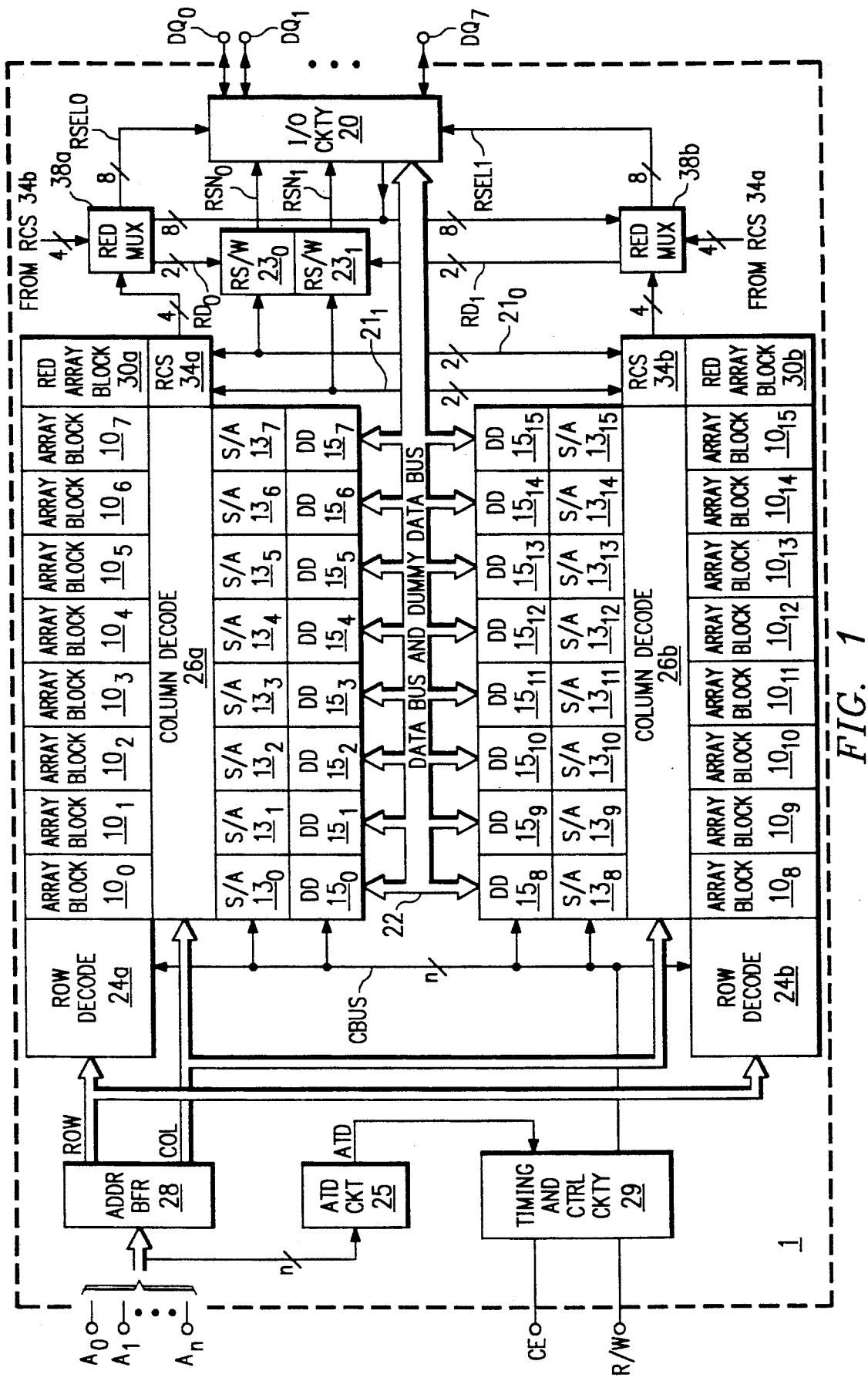
FIG. 1 is an electrical diagram, in block form, of a memory incorporating the preferred embodiment of the invention.

Referring now to FIG. 1, an example of an integrated circuit into which the preferred embodiment of the invention is implemented will be described. In this example, memory 1 is a static random access memory (SRAM) of otherwise conventional architecture, having its memory cells in multiple blocks 10 which are shown, in FIG. 1, according to an example of their physical location in such a memory. It is contemplated that integrated circuits of other types having memory arrays including redundant columns may also benefit from the present invention, such integrated circuits including other types of memories including read-only memories, FIFOS, DRAMs and the like, as well as microprocessors and other logic devices having embedded memories.

As is conventional, memory cells in memory 1 are arranged in rows and columns. In this example, memory 1 is a 128k-by-8 1 Mbit SRAM, memory 1 includes 1024 columns for each of 1024 rows; of course, the present invention is applicable to other row-by-column organizations, according to the memory density and functionality. It should be noted that the designation of rows and columns in memory 1, and particularly the redundant column architecture to be described hereinbelow, uses the term row to refer to the array direction in which a plurality of memory cells are selected by way of a word line; in conventional memories, each of the memory cells in the selected row are generally coupled to one or a complementary pair of bit lines. The term column is used in this description to refer to the array direction in which one or more of the memory cells in the selected row are selected for read or write access; in conventional memories, this is generally accomplished by coupling one of the bit lines to a sense amplifier/write circuit, or to an internal data bus. It is contemplated that such use of the terms rows and columns is consistent with the general understanding in the art.

Address terminals $A_0$ through $A_n$ receive an address signal according to which the memory cells to be accessed are designated. In the conventional manner, address terminals $A_0$ through $A_n$ are connected to address buffers 28, which buffer the received address signal and communicate a portion of the address signal to row decoders 24a, 24b on bus ROW, and communicate the remainder to column decoders 26a, 26b on bus COL. Row decoders 24a, 24b select a row of memory cells by enabling the selected word line in the conventional manner, and in this example are located along a side of the memory array blocks 10. Column decoders 26a, 26b, in this example, select eight memory cells in the selected row to be sensed by a sense amplifier 13 according to the column portion of the address.

In memory 1 according to this example, the memory cells are grouped into sixteen primary array blocks $10_0$ through $10_{15}$. The number of array blocks 10 may, of course, vary from implementation to implementation, according to the desired functionality of memory 1. This partitioning of the memory into sixteen primary array blocks 10 is particularly beneficial in low power memories, such as may be used in portable computers, as only the block 10 in which the selected memory cells are located need be enabled during a cycle. In this example, each primary array block 10 includes 64 columns. Selection of the block may be done according to one of the row address bits (indicating upper or lower half) and to four of the column address bits (indicating one of sixteen primary array blocks 10 to be selected). Further reduction in the active power may be obtained by the implementation of latched row line repeaters between primary array blocks. 10, as described in co-pending application Ser. No. 588,609, now U.S. Pat. No. 5,121,358 filed Sept. 26, 1990, assigned to SGS-Thomson Microelectronics, Inc., and incorporated herein by reference.

Alternatively, selection of a row within one of said primary array blocks 10 may be made by way of a global word line generated by row decoders 24a, 24b, extending across those primary array blocks 10 for which it is operable. Pass gates by which memory cells within each of primary array blocks 10 are connected to their bit lines are, in this alternative arrangement, controlled by local word lines which extend only within each primary array block 10 for each row portion therein. In this arrangement, pass transistors connected between each global word line and the local word lines are enabled according to a block portion of the column address, so that only the local word line associated with the primary array block 10 selected by the column address is enabled, thus reducing the active power dissipation of each memory cycle. An example of such an arrangement is described in Sakurai, et al., "A Low Power 46 ns 256 kbit CMOS Static RAM with Dynamic Double Word Line", *IEEE J. Solid State Circuits*, Vol. SC-19, No. 5 (IEEE, October 1984), pp. 578-585, incorporated herein by this reference.

Memory 1, as in the case of most modern SRAMs and DRAMs, includes some amount of dynamic operation, such as precharging and equilibration of certain nodes (e.g., bit lines) at particular points in the memory cycle. Initiation of the cycle in SRAM 1 occurs by way of address transition detection, performed by address transition detection (ATD) circuit 25. ATD circuit 25 is connected to each of the address inputs $A_o$ through $A_n$, preferably prior to address buffers 28 (as shown), and generates a pulse on line ATD responsive to detecting a transition at any one or more of address inputs $A_o$ through $A_n$, such a pulse useful in controlling the internal operation of memory 1 in the conventional manner. A preferred example of ATD circuit 25 and address buffers 28 is described in copending application Ser. No. 601,287, now U.S. Pat. No. 5,124,584, filed Oct. 22, 1990, assigned to SGS-Thomson Microelectronics, Inc. and incorporated herein by this reference.

Other internal operational functions are controlled by timing and control circuitry 29, which receives the signal on line ATD from ATD circuit 25, and which also receives certain external control signals such as the chip enable signal at terminal CE, and the read/write select signal at terminal R/W. Timing and control circuitry 29 generates various control signals based on these inputs, for control of the various functions within memory 1 in the conventional manner. As shown in FIG. 1, control bus CBUS is connected to sense amplifiers 13 and data drivers 15; other functions are similarly controlled by timing and control circuitry 29 in the conventional manner, with their connections not shown in FIG. 1 for purposes of clarity.

Memory 1 in this example is of the byte-wide type, and as such it has eight input/output terminals $DQ_0$ through $DQ_7$ at which output data is presented during a read operation, and at which input data is received during a write operation. Input/output circuitry 20 is connected between data bus 22 and terminals DQ, and includes conventional input and output buffers connected thereto. A preferred type of output buffer is described in copending application Ser. No. 809,387, filed Dec. 17, 1991, assigned to SGS-Thomson Microelectronics, Inc., and incorporated herein by this reference.

Each of primary array blocks $10_0$ through $10_{15}$ is associated with a corresponding group of sense amplifiers $13_0$ through $13_{15}$, as shown in FIG. 1. In this example, eight individual sense amplifiers 13 are included within each group of sense amplifiers $13_0$ through $13_{15}$, one sense amplifier 13 for each of the eight bits to be communicated on internal data bus 22 from the selected one of primary array blocks $10_0$ through $10_{15}$. Groups of data drivers $15_0$ through $15_{15}$ are each associated with a corresponding group of sense amplifiers $13_0$ through $13_{15}$ for receiving the data signal therefrom and for driving internal data bus 22 therewith; individual data drivers 15 are associated with individual sense amplifiers 13 in each group, one data driver 15 for driving each line in data bus 22.

In this example, the memory array is also divided into halves, with primary array blocks $10_0$ through $10_7$ in one array half and primary array blocks $10_8$ through $10_{15}$ in the other half. Internal data bus 22 runs the length of the array halves, and is located therebetween as shown in FIGS. 1. In this example, data bus 22 includes eight data conductors, each associated with an input/output terminal $DQ_0$ through $DQ_7$ and coupled thereto via input/output circuitry 20. Each individual data conductor is connected to a corresponding data driver 15 in each of the sixteen data driver groups $15_0$ through $15_{15}$ of the sixteen primary array blocks $10_0$ through $10_{15}$. For a read/write memory such as memory 1, a separate input data bus can be used to communicate input data to be written to the selected memory cells, in the conventional manner. Alternatively, the input data may also be communicated along data bus 22, as is conventional for some memory designs.

In this example, data bus 22 also preferably includes eight dummy data conductors, each of which are also connected to a corresponding data driver 15 in each of the sixteen data driver groups $15_0$ through $15_{15}$ of the sixteen primary array blocks $10_0$ through $10_{15}$, for purposes of precharging data bus 22 by way of charge sharing, as described in copending application Ser. No. 809,735, filed Dec. 17, 1991, assigned to SGS-Thomson Microelectronics, Inc. and incorporated herein by this reference. As described therein, each of these dummy data conductors preferably physically resembles one of the true data conductors, preferably having substantially the same length and cross-sectional area and being formed of the same material, and is maintained, at all times, at a complementary state relative to its true data conductor.

Figure 2:
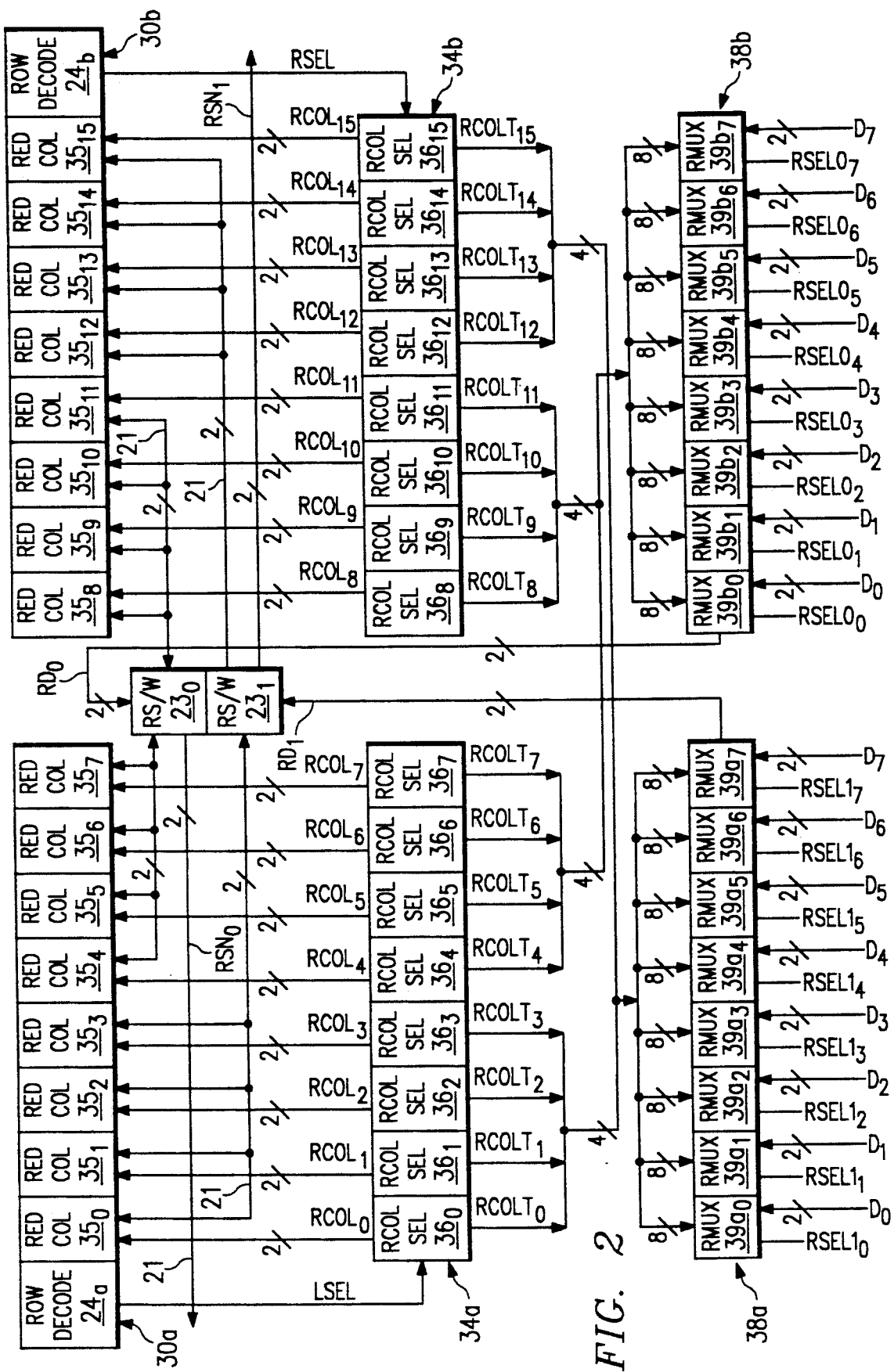
FIG. 2 is an electrical diagram, in block form, of the redundant column architecture in the memory of FIG. 1.

Referring to FIGS. 1 and 2 in combination, memory 1 also includes a pair of redundant array blocks 30a, 30b, each associated with one of the half-arrays of primary array blocks 10. FIG. 2 illustrates the redundancy architecture of memory 1 in block functional form, without relation to the layout suggested in FIG. 1. In this embodiment, redundant array block 30a has eight redundant columns $35_0$ through $35_7$ therein, each containing memory cells selectable according to a row line issued from row decoder 24a corresponding to the same row addresses by which memory cells are selected in primary array blocks $10_0$ through $10_7$. Similarly, redundant array block 30b has eight redundant columns $35_8$ through $25_{15}$ therein, each containing memory cells selectable according to a row line issued from row decoder 24b according to the same row addresses by which memory cells are selected in primary array blocks $10_8$ through $10_{15}$. As will be described in further detail hereinbelow, each of the eight redundant columns 35 in each of the redundant array blocks 30a, 30b may replace a column in any one of the primary array blocks 10 in its array half (i.e., selectable by a row line from the same row decoder 24a, 24b, respectively), and may be associated with any one of the input/output terminals DQ.

Associated with redundant array blocks 30a, 30b are redundant column select blocks 34a, 34b, respectively. Each of redundant column select blocks 34a, 34b contain a redundant column decoder 36 for each of the redundant columns 35 in its associated redundant array block 30a, 30b, respectively. Each redundant column decoder 36 includes fuses by which the column address to which its associated redundant column 35 corresponds can be selected, receives the column address on bus COL, and issues a select signal on a line RCOL to its associated redundant column 35. Redundant column decoders 36a, 36b also each receive a row select line LSEL, RSEL, respectively, from row decoders 24a, 24b, respectively; lines LSEL, RSEL each indicate if the selected row is within the half array associated with row decoders 24a, 24b, respectively, and accordingly corresponds to the state of the most significant row address bit. Each redundant column decoder 36 is operable to issue the select signal on its output line RCOL, when redundancy is enabled, if the column address on bus COL matches the address indicated by the state of its fuses and if the select signal on its associated row select line LSEL, RSEL indicates that a row in its half array is selected. The operation of redundant column decoders 36 will be described in further detail hereinbelow.

Two redundant sense/write circuits $23_0$, $23_1$ are provided in this embodiment of the invention, each capable of sensing the stored data state in a selected memory cell in a redundant column 35, and for writing data thereto, depending upon whether a read operation or a write operation is being effected. In this embodiment of the invention, redundant sense/write circuits $23_0$, $23_1$ are each associated with four redundant columns 35 in each redundant array block 30a, 30b, and connected thereto by way of a complementary redundant data bus 21. For example, redundant sense/write circuit $23_0$ is associated with redundant columns $35_4$ through $35_7$ of redundant array block 30a and with redundant columns $35_8$ through $35_{11}$ of redundant array block 30b, and redundant sense/write circuit $23_1$ is associated with redundant columns $35_0$ through $35_3$ of redundant array block 30a and with redundant columns $35_{12}$ through $35_{15}$ of redundant array block 30b. Each redundant sense/write circuit 23 presents sensed (i.e., read) data to input/output circuitry 20 via a single pair of complementary data lines RSN, and receives input (i.e., write) data on a single pair of complementary lines $RD_0$, $RD_1$, respectively, from redundant multiplexer blocks 38b, 38a, respectively.

Redundant multiplexer blocks 38a, 38b each include eight redundant multiplexers 39, one associated with each input/output terminal DQ; redundant multiplexer block 38a is associated with redundant sense/write circuit $23_1$, and redundant multiplexer block 38b is associated with redundant sense/write circuit $23_0$. Each redundant multiplexer 39 receives all eight redundant column select signals RCOL generated by those redundant column decoders 36 associated with its associated redundant sense/write circuit 23. In this example, redundant multiplexer block 38a receives redundant column select signals $RCOL_0$ through $RCOL_3$ and $RCOL_{12}$ through $RCOL_{15}$, while redundant multiplexer block 38b receives redundant column select signals $RCOL_4$ through $RCOL_{11}$. Each of the redundant multiplexers 39 include fuses for determining which one (or more) of its received redundant column select signals RCOL corresponds to its associated input/output terminal DQ, and couples the output of its associated redundant sense/write circuit 23 to the driver for its associated input/output terminal DQ by way of a signal on its output line RSEL; in addition, each redundant multiplexer 39 also couples differential input data lines DT, DC to its associated redundant sense/write circuit 23 according to the fuses opened therein.

By way of example, redundant multiplexer $39a_o$ is associated with redundant sense/write circuit $23_l$ and with input/output terminal $DQ_o$. Redundant multiplexer receives redundant column select signals $RCOL_0$ through $RCOL_3$ from redundant column decoders $36_0$ through $36_3$ in redundant column select block 34a, and redundant column select signals $RCOL_{12}$ through $RCOL_{15}$ from redundant column decoders $36_{12}$ through $36_{15}$ in redundant column select block 34b. Fuses within redundant multiplexer $39a_o$ will, as will be described in further detail hereinbelow, select the one (or more) of redundant column select signals $RCOL_0$ through $RCOL_3$ and $RCOL_{12}$ through $RCOL_{15}$ for which it will issue an active signal on line $RSEL1_0$ upon receipt of one of redundant column select signals $RCOL_n$ which matches the fuse pattern in redundant multiplexer $39a_o$. This will cause input/output circuitry 20 to couple input/output terminal $DQ_0$ to redundant sense/write circuit $23_1$, and thus to the matching redundant column $35_n$ selected by the appropriate redundant column decoder $36_n$, rather than to data bus 22 and thus to the selected memory cells in primary array blocks 10.

In this embodiment of the invention, redundant multiplexers 39 also couple the input data from the appropriate input/output terminal DQ to sense/write circuits $23_0$, $23_1$ on complementary lines $RD_0$, $RD_1$, respectively, responsive to the state of the fuses therein and to the redundant column select signals on lines RCOL.

Figure 3:
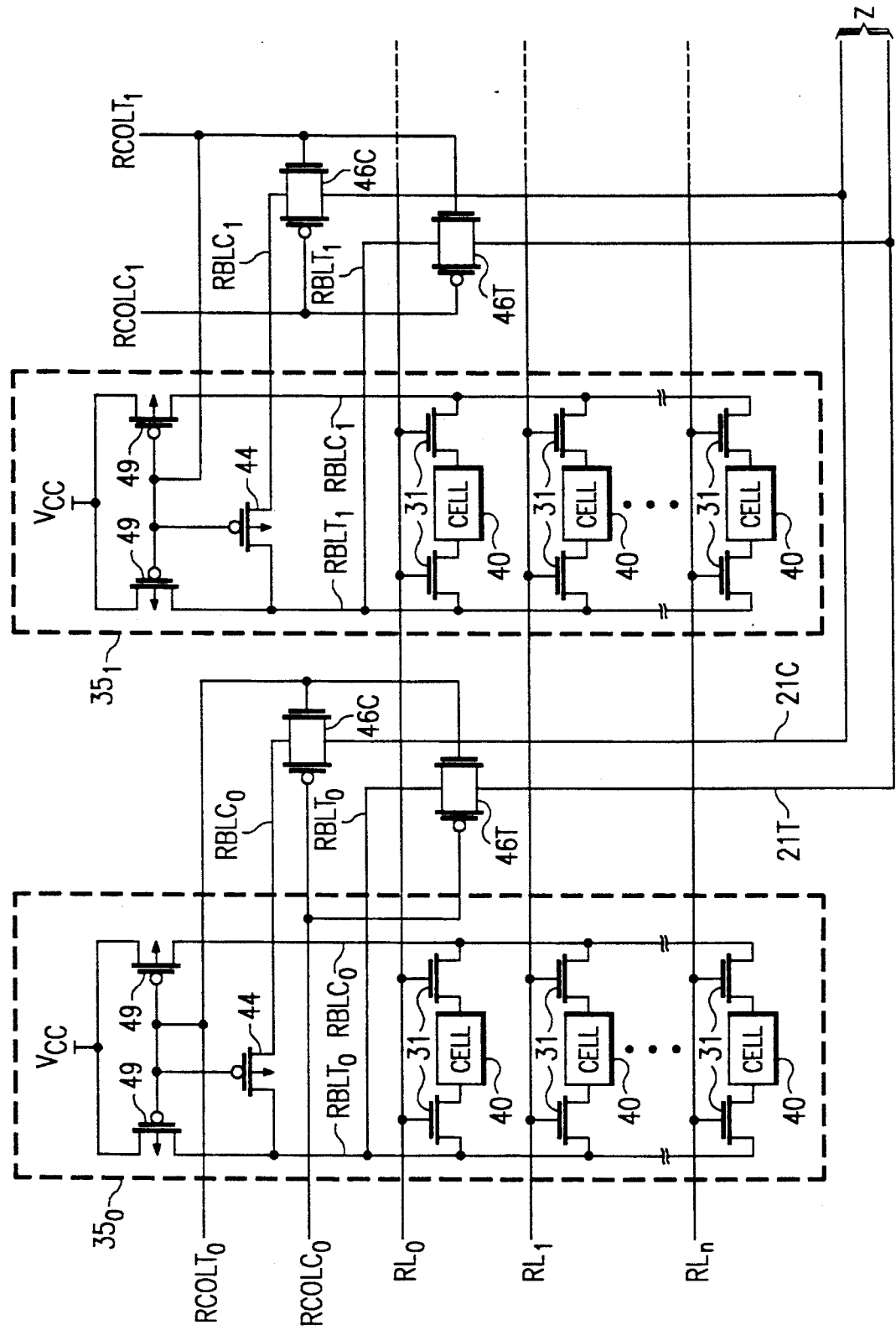
FIG. 3 is an electrical diagram, in schematic form, of a pair of redundant columns in the architecture of FIG. 2.

Referring now to FIG. 3, an example of the construction and operation of redundant columns 35 as implemented in the preferred embodiment of the invention will now be described. Redundant columns $35_0$, $35_1$ shown in FIG. 3 are constructed similarly as described in copending application Ser. No. 627,403, filed Dec. 14, 1990, assigned to SGS-Thomson Microelectronics, Inc., and incorporated herein by this reference. As shown in FIG. 3, redundant columns $35_0$, $35_1$ are constructed in the conventional manner for an SRAM; columns in primary array blocks 10 (and, of course, the others of redundant columns 35) are similarly constructed. Redundant column $35_0$ includes, in this example, 256 memory cells 40, each connectable to differential bit lines $RBLT_0$ and $RBLC_0$ (true and complement, respectively) by way of pass gates 31; pass gates 31 for each of the 256 memory cells 40 are controlled by an associated local row line RL, so that the enabling of one of the 256 local row lines RL will cause pass gates 31 for one and only one memory cell 40 in redundant column $35_0$ to be connected to bit lines $RBLT_0$ and $RBLC_0$. Local row lines RL are common for redundant columns $35_0$, $35_1$ illustrated in FIG. 3, and for all redundant columns 35 in redundant column array block 30a.

Bit lines $RBLT_0$ and $RBLC_0$ in redundant column $35_0$ are each connected to the drain of a p-channel transistor 49; the sources of transistors 49 are connected to a precharge voltage, which in this case is $V_{cc}$, and the gates of transistors 49 are controlled by line $RCOLC_0$, issued by redundant column decoder $36_0$ associated with redundant column $35_0$, as will be described hereinbelow. Transistors 49 precharge bit lines $RBLT_0$ and $RBLC_0$ when line $RCOLC_0$ is at a low logic level, which occurs when redundant column $35_0$ is not selected. P-channel equilibration transistor 44 has its source-to-drain path connected between bit lines $RBLT_0$ and $RBLC_0$, and its gate connected to line $RCOLC_0$, so that during such time as line $RCOLC_0$ is low (i.e., during precharge via transistors 49), bit lines $RBLT_0$ and $RBLC_0$ are equilibrated to the same potential, which in this case is $V_{cc}$. Conversely, when redundant column $35_0$ is to be selected, as indicated by line $RCOLC_0$ going low, precharge transistors 49 and ecfuilibration transistor 44 are turned off, allowing the selected memory cell 40 to place a differential signal on bit lines $RBLT_0$, $RBLC_0$ via pass gates 31.

Bit lines $RBLT_0$ and $RBLC_0$ are connected to pass gates 46T, 46C, respectively, which control the coupling of bit lines $RBLT_0$ and $RBLC_0$ to redundant data bus 21, and thus to its associated redundant sense/write circuit $23_1$. Pass gates 46T, 46C each include n-channel and p-channel transistors connected in parallel, with the gate of the n-channel transistor controlled by line $RCOLT_0$ and the gate of the p-channel transistor controlled by line $RCOLC_0$. When redundant column $35_0$ is to be selected, its associated redundant column decoder $36_0$ will drive line $RCOLT_O$ high and line $RCOLC_O$ low. Pass gates 46T, 46C thus connect bit lines $RBLT_0$, $RBLC_0$, to redundant data bus lines 21T, 21C, respectively, placing the selected memory cell 40 in communication with redundant sense/write circuit $23_1$, in this case, for communication of data therebetween.

In this example, when the column address presented to memory 1 does not match the address of the column to be replaced by redundant column $35_0$, its associated redundant column decoder $36_0$ will cause line $RCOLC_0$ to be driven high and line $RCOLT_0$ to be driven low. Responsive to line $RCOLC_0$ being high, bit lines $RBLT_0$ and $RBLC_0$ will not be connected to redundant data bus 21, and precharge transistors 49 and equilibration transistor 44 will be turned on.

Figure 4:
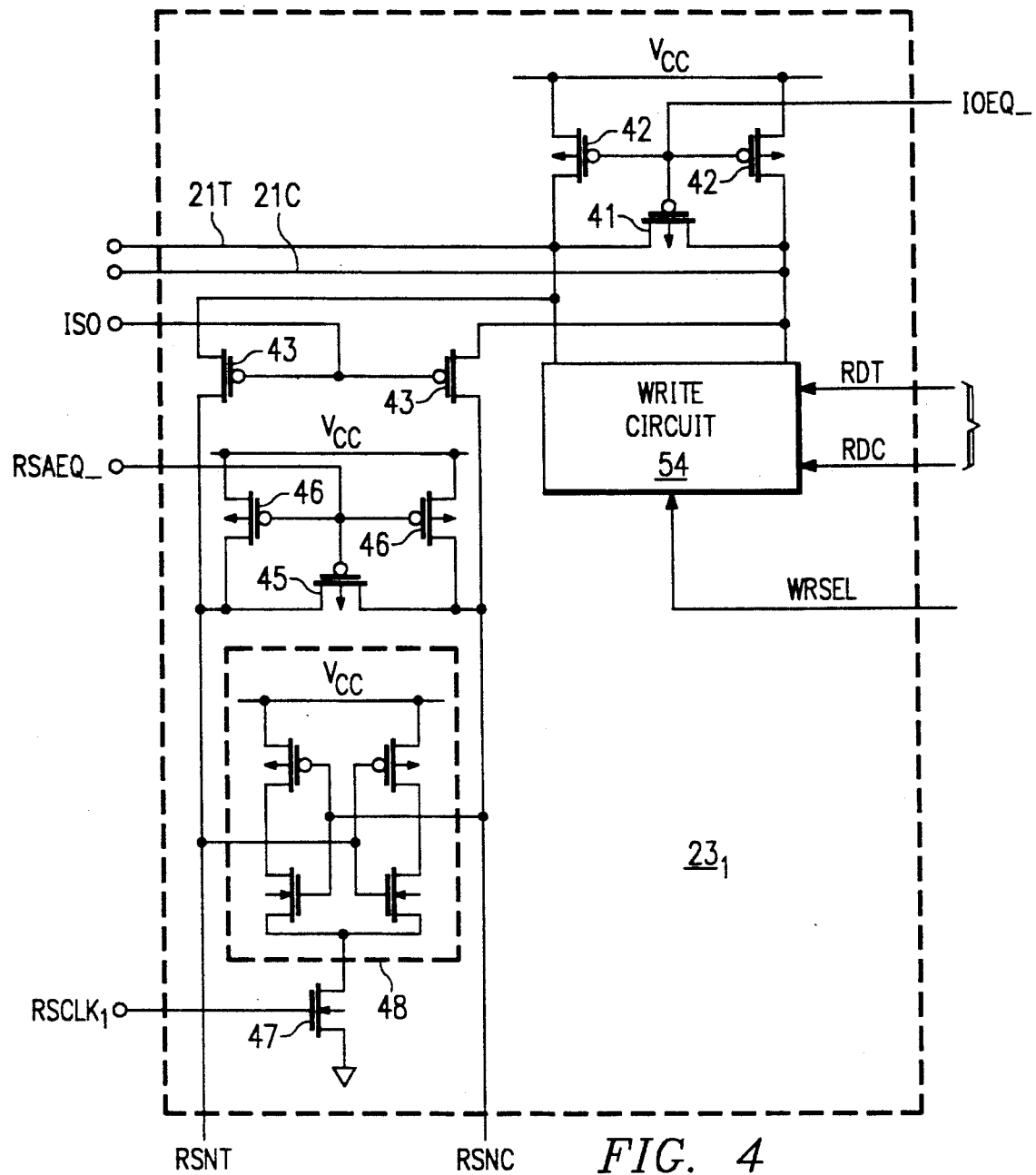
FIG. 4 is an electrical diagram, in schematic form, of a sense/write circuit in the architecture of FIG. 2.

Referring now to FIG. 4, the construction of an example of redundant sense/write circuit 23, including both read and write paths, will now be described. Further detail regarding the construction and operation of this example of redundant sense/write circuitry 23 is provided in the above-incorporated copending application Ser. No. 627,403. of course, other conventional sense amplifier and write driver designs may be used in place of that shown in FIG. 4, it being understood that the example of redundant sense/write circuit 23 is provided herein by way of example only.

Differential redundant data bus lines 21T, 21C are each connected to the drain of a p-channel precharge transistor 42; the sources of transistors 42 are both connected to the precharge voltage for the redundant data bus lines 21T, 21C, which in this case is $V_{cc}$. Redundant data bus lines 21T, 21C are also connected to one another by p-channel equilibration transistor 41. The gates of transistors 41 and 42 are connected to line IOEQ_, which is generated by timing and control circuitry 29 responsive to an address transition detected by ATD circuit 25, or to such other events during the cycle responsive to which their equilibration is desired.

On the read side of redundant sense/write circuit $23_1$, redundant data bus lines 21T, 21C are each connected to a p-channel pass transistor 43 which has its gate controlled by an isolate signal on line ISO. Accordingly, redundant data bus lines 21T, 21C, may be isolated from the read circuitry by line ISO at a high logic level, and may be connected thereto by line ISO at a low logic level. The complementary lines on the opposite side of pass transistors 43 from redundant data bus lines 21T, 21C are referred to in FIG. 4 as sense nodes RSNT and RSNC, respectively. As shown in FIGS. 1 and 2, sense nodes RSNT, RSNC are communicated to input/output circuitry 20 from each of redundant sense amplifiers $23_0$, $23_1$.

Sense nodes RSNT and RSNC are also preferably precharged and equilibrated during the appropriate portion of the cycle, as sense amplifier 48 within redundant sense/write circuit $23_1$ operates in dynamic fashion, as will be described hereinbelow. P-channel precharge transistors 46 each have their source-to-drain paths connected between $V_{cc}$ and sense nodes RSNT and RSNC, respectively. Equilibration transistor 45 is a p-channel transistor having its source-to-drain path connected between sense nodes RSNT and RSNC. The gates of transistors 45 and 46 are controlled by line RSAEQ_which, when at a low level, precharges and equilibrates sense nodes RSNT and RSNC in similar manner as described above relative to bit lines RBLT, RBLC and redundant data bus lines 21T, 21C.

Sense amplifier 48 is a conventional CMOS latch consisting of cross-coupled inverters therewithin; the inputs and outputs of the cross-coupled latches are connected to sense nodes RSNT and RSNC in the conventional manner. N-channel pull-down transistor 47 has its source-to-drain path connected between the sources of the n-channel transistors in sense amplifier 48 and ground, and has its gate controlled by line $RSCLK_1$.

Pull-down transistor 47 provides dynamic control of sense amplifier 48, so that the sensing of sense nodes RSNT and RSNC is performed in dynamic fashion. As is well known in dynamic RAMS, the dynamic sensing in this arrangement is controlled with transistor 47 initially off at the time that pass transistors 43 connect sense nodes RSNT and RSNC to input/output lines 21T and 21C, respectively; during this portion of the cycle, sense amplifier 48 is presented with a small differential voltage between sense nodes RSNT and RSNC. After development of this small differential voltage, line $RSCLK_1$ is driven high, so that the sources of the pull-down transistors in sense amplifier 48 are pulled to ground. This causes sense amplifier 48 to develop a large differential signal on sense nodes RSNT and RSNC, and latch the sensed state of sense nodes RSNT and RSNC.

As will be described in further detail hereinbelow, it is preferable in this embodiment of the invention that the control signals $RSCLK_1$ is controlled so that both redundant sense/write circuits 23 are enabled to sense at the beginning of each cycle, regardless of the address value. If the address received and decoded by memory 1 does not correspond to any of the columns to be replaced by one of redundant columns 35 associated therewith, control signals ISO, RSAEQ_, and $RSCLK_1$ are then preferably controlled to disable the redundant sense/write circuits 23. In this way, because the enabling of a redundant sense/write circuit 23 does not depend on the address, the access time for memory cells 40 in redundant columns 35 is not slowed relative to an access to a memory cell in a primary array block 10 by the additional decoding of redundant column decoders 36. When disabled (by lines ISO maintained high, and lines RSAEQ_and $RSCLK_1$ maintained low) sense nodes RSNT and RSNC in sense/write circuits 23 remain equilibrated and precharged to $V_{cc}$.

Write circuitry 54 in redundant sense/write circuit $23_1$ receives input data on lines RDT, RDC from redundant multiplexers 39a, 39b, as indicated in FIGS. 1 and 2 hereinabove, and also receives a write control signal WRSEL from timing and control circuitry 29. During write operations, as noted hereinabove, line ISO is driven high so that transistors 43 are off and so that the input data presented on redundant data bus lines 21 is not sensed by sense amplifier 48. Write circuitry 54 includes conventional write drivers for presenting a differential signal on redundant data bus lines 21T, 21C corresponding to the differential data on lines RDT, RDC, when enabled by line WRSEL. The above-incorporated copending application Ser. No. 627,403 describes a preferred example of such write circuitry.

Figure 5:
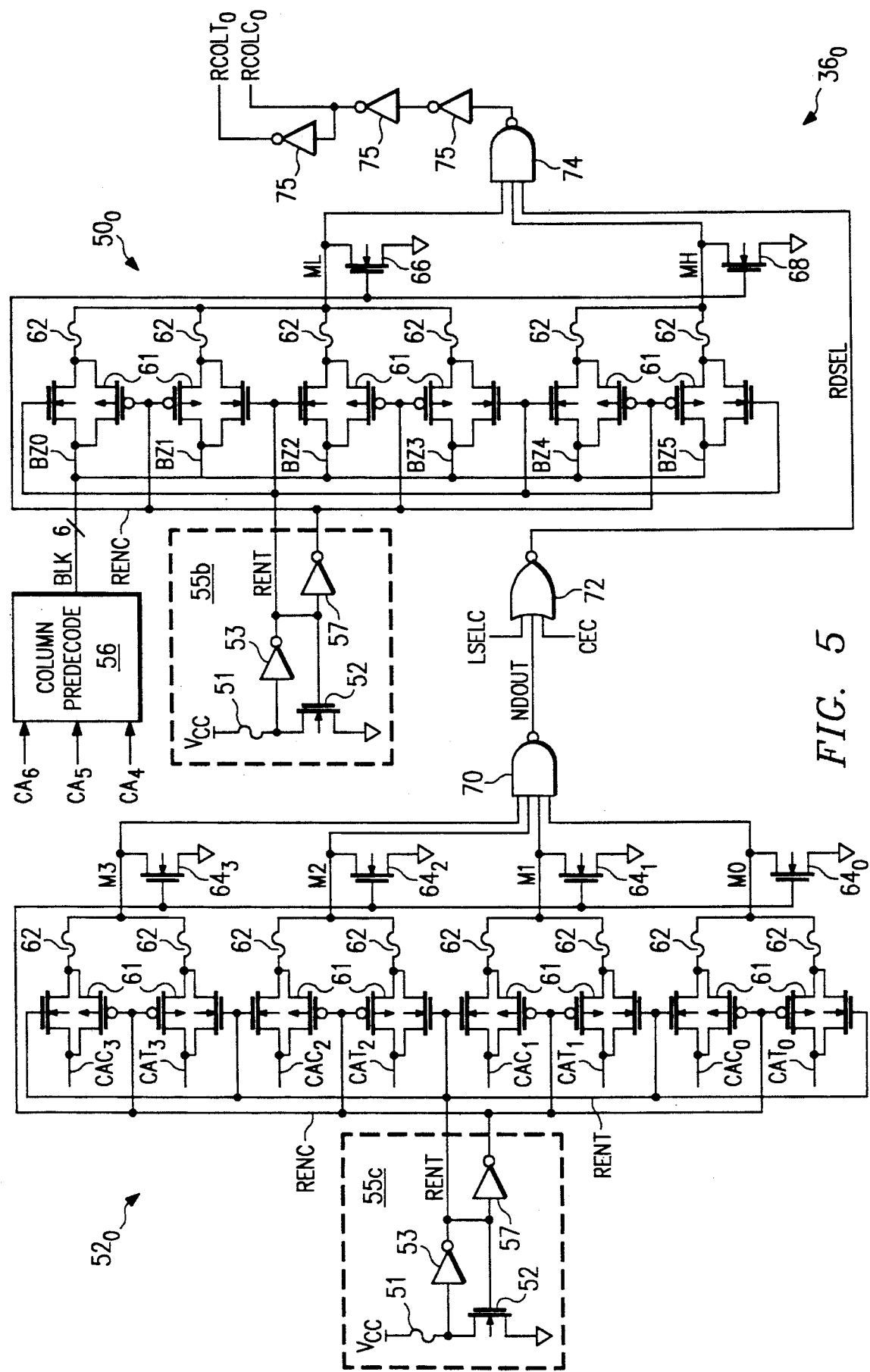
FIG. 5 is an electrical diagram, in schematic form, of one of the redundant column select circuits in the architecture of FIG. 2.

Referring now to FIG. 5, the construction of one of redundant column decoders 36 will now be described in detail. While redundant column decoder $36_0$ is shown in FIG. 5 and described herein by way of example, redundant column decoders $36_1$ through $36_{15}$ will of course be similarly constructed. As indicated hereinabove, each of redundant column decoders 36 include fuses by which redundancy is enabled for its associated redundant column 35, and by which the column address of the primary column to be replaced thereby is specified. In this embodiment of the invention, the fuses are preferably conventional fuses, such as polysilicon fuses, and are preferably opened by a laser, electrical overstress, or other conventional techniques. Of course, other types of fuses, as well as antifuses and other permanently programmable selection techniques, may be used in the alternative to such fuses.

According to the preferred embodiment of the invention, redundant column decoder $36_0$ includes block select $50_0$ and column select $52_0$. Column select $52_0$ receives, on lines CAT, CAC, true and complement signals corresponding, in this example, to the four least significant column address bits of the address received by address buffers 28. The three most significant column address bits $CA_4$ through $CA_6$, after buffering, are decoded by column predecoder 56 (located in column decoders 26a, 26b, for example) in a similar manner as used to select one of the eight primary array blocks $10_0$ through $10_7$. While this particular example of redundant column decoder $36_0$ decodes the column address using predecoded signals for the three most significant column address bits, it is of course contemplated that the use of predecoding, and the extent to which it us used, can be varied within the present invention. For best efficiency, however, it is desirable that the redundant column decoding match that used in decoding the columns in primary array blocks 10. Since each primary array block 10, in this example, includes 128 columns, eight of which are accessed by each column address value, sixteen column addresses are located within each primary array block 10. It is therefore preferred that the redundant column decoders 36 each also include a one-of-sixteen column select portion 52, so that the block select lines in bus BLK can be used directly.

In this embodiment of the invention, the output from column predecoder 56 includes six block select lines BZ0 through BZ5, communicated to block select $50_0$ on bus BLK. Selection of one of eight blocks is made by the combination of either of block lines BZ4 or BZ5 high with one of the four block select lines BZ0 through BZ3 high. The eight blocks are selected according to the truth table of Table 1:

TABLE 1

| Block | BZ5 | BZ4 | BZ3 | BZ2 | BZ1 | BZ0 |
|---|---|---|---|---|---|---|
| 0 | 0 | 1 | 0 | 0 | 0 | 1 |
| 1 | 0 | 1 | 0 | 0 | 1 | 0 |
| 2 | 0 | 1 | 0 | 1 | 0 | 0 |
| 3 | 0 | 1 | 1 | 0 | 0 | 0 |
| 4 | 1 | 0 | 0 | 0 | 0 | 1 |
| 5 | 1 | 0 | 0 | 0 | 1 | 0 |
| 6 | 1 | 0 | 0 | 1 | 0 | 0 |
| 7 | 1 | 0 | 1 | 0 | 0 | 0 |

It is contemplated that such decoding can be readily expanded by one of ordinary skill in the art. For example, sixteen blocks may be comprehended per array half by predecoding an additional column address bit, resulting in two additional lines BZ6, BZ7, so that one of sixteen blocks would be selected by one of lines BZ4 through BZ7 being high in combination with one of lines BZ0 through BZ3 being high. Other conventional predecoding schemes will, of course, be apparent to those of ordinary skill in the art.

Block select $50_0$ shown in FIG. 5 includes an enable circuit 55 for enabling its operation in the event that its associated redundant column $35_0$ is to replace a column in a primary array block 10, and for disabling its operation otherwise. Enable circuit 55b includes fuse 51 connected between $V_{cc}$ and the drain of n-channel transistor 52; the source of transistor 52 is connected to ground. The drain of transistor 52 is connected to the input of inverter 53, which drives line RENT at its output. The output of inverter 53 is also connected to the gate of transistor 52, and to the input of inverter 57 which drives line RENC at its output. Accordingly, with fuse 51 intact (as is the case when redundancy is not enabled), $V_{cc}$ is presented to the input of inverter 53 which presents a low logic level at its output on line RENT, maintaining transistor 52 off; line RENC is driven high by inverter 57. When fuse 51 is opened (as is the case when redundancy is enabled), transistor 52 eventually turns on as the input to inverter 53 leaks to ground by way of junction leakage through transistor 52. A high logic level then appears at line RENT, maintaining transistor 52 on and the input of inverter 53 at ground, and also driving a low logic level at the output of inverter 57 on line RENC.

Lines RENT, RENC from enable circuit 55b are connected to a plurality of pass gates 61 in block select $50_0$, each of pass gates 61 including n-channel and p-channel transistors in parallel. The gate of each of the n-channel transistors receives line RENT and the gate of each of the p-channel transistors receives line RENC. Each of pass gates 61 receives one of the block lines of line BLK from column predecode 56 on one side, and is connected to a fuse 62 on its other side. The four fuses 62 associated with block select lines BZ0 through BZ3 are connected together at node ML, which is connected to a first input of NAND gate 74. Pull-down n-channel transistor 66 has its source/drain path connected between node ML and ground, and has its gate controlled by line RENC so that transistor 66 is on when redundancy is not enabled, and so that transistor 66 is off when redundancy is enabled. The two fuses 62 associated with block select lines BZ4, BZ5 are connected together at node MH and to a second input of NAND gate 74; n-channel transistor 68 is similarly connected between node MH and ground, with its gate also controlled by line RENC in the same manner as transistor 66.

The output of NAND gate 74 presents signals on lines $RCOLC_0$, $RCOLT_0$, via two and three inverters 75, respectively, which are communicated to redundant column $35_0$ as described hereinabove. In this embodiment of the invention, therefore, redundant column $35_0$ is selected only when the output of NAND gate 74 is low, which occurs only when all three inputs thereto (nodes MH, ML, and RDSEL) are high.

The third input of NAND gate 74, on line RDSEL, is generated by NOR gate 72 in column select $52_0$. NOR gate 72 receives an input on line NDOUT from NAND gate 70, and also receives an input on line LSELC from row decoder 24a (indicating with a low logic level that a row in the array half associated with redundant column decoder $36_0$ is being selected), and an input on line CEC (indicating with a low logic level that memory 1 is enabled).

Column select $52_0$ similarly includes an enabling circuit $55c$, which is constructed and operates similarly as enabling circuit $55b$, generating signals on its lines RENT, RENC as described hereinabove. column select $52_0$ receives eight lines from bus COL (see FIGS. 1 and 2) on which is communicated true and complement signals for each of the four least significant column address bits $CA_0$ through $CA_3$. Each of the lines from bus COL is connected to one side of a pass gate 61, and in turn to a fuse 62; pass gates 61 are connected to and controlled by lines RENT, RENC in similar manner as in block select $50_0$ described hereinabove.

In column select $52_0$, the pair of fuses 62 associated with the true and complement lines CAT, CAC for the same address bit are connected together and communicated to an input of NAND gate 70. For example, true and complement column address lines $CAT_3$, $CAC_3$, respectively, are connected via pass gates 61 and fuses 62 to a common node M3, and to an input of NAND gate 70. N-channel pull-down down transistor $64_3$ has its source/drain path connected between node M3 and ground, and has its gate connected to line RENC so that, when redundancy is not enabled, transistor $64_3$ is turned on, and so that transistor $64_3$ is turned off when redundancy is enabled. Nodes M0 through M2 also provide inputs to NAND gate 70, and are each connected to the pair of fuses 62 associated with their true and complement column address signals, respectively. As will be evident hereinbelow, the selection of redundant column $35_0$ requires that all three of nodes M0 through M3 are high, so that the output of NAND gate 70 is low, enabling the output of NOR gate 72 to be high, in turn enabling the output of NAND gate 74 to be low.

The operation of redundant column decoder $36_0$ according to this embodiment of the invention will now be described in detail. It should first be noted that the use of one of redundant columns 35 does not necessitate the use of all redundant columns 35, as column decoders 36 are individually enabled by enabling circuits $55b$, $55c$ therewithin. In the event that, in this example, redundant column $35_0$ is not to replace a primary column, fuses 51 in enabling circuits $55b$, $55c$ are both left intact. As discussed above, this forces lines RENT to be low at the output of each of enabling circuits $55b$, $55c$, maintaining all pass gates 61 off. Transistors $64_0$ through $64_3$, 66, and 68 are all maintained on, forcing the output of NAND gates 70, 74 both high. The high level at the output of NAND gate 74 is communicated to redundant column $35_0$ as a high level on line $RCOLC_0$ and a low level on line $RCOLT_0$, turning off pass gates 46T, 46C therein (see FIG. 3), and isolating redundant column $35_0$ from being accessed.

If redundant column $35_0$ is to replace a primary column in one of primary array blocks 10, selected fuses in redundant column decoder 36 are opened, for example by way of a laser beam. Regardless of the address to be replaced, fuses 51 in both enabling circuits $55b$, $55c$ are opened, forcing line RENT high and line RENC low in each, turning on all pass gates 61 and turning off all transistor $64_0$ through $64_3$, 66, and 68. Column select $52_0$ and block select $50_0$ are thus enabled to compare the incoming column address value against that specified by the blowing of fuses 62.

The address of the column to be replaced is programmed into column select $52_0$ by blowing those fuses 62 which do not correspond to the four least significant bits of the address of the column to be replaced. For example, if the four least significant bits of the address of the column to be replaced are 0110 (addresses $CA_3$, $CA_2$, $CA_1$, $CA_0$, respectively), fuses 62 associated with lines $CAT_3$, $CAC_2$, $CAC_1$, and $CAT_0$ are opened. All of nodes M0 through M3 will thus be high, and the output of NAND gate 70 low, only if the four least significant bits of the column address are 0110; as noted hereinabove, the output of NAND gate 70 must be low in order for redundant column $35_0$ to be selected. Any other four bit value will cause at least one of nodes M0 through M3 to be low, causing the output of NAND gate 70 to be forced high, preventing the selection of redundant column $35_0$.

Block decode $50_0$ is similarly programmed, by opening fuse 51 in enabling circuit $55b$ and by opening those fuses which do not correspond to the desired block select code of the column to be replaced by redundant column $35_0$. For example, if the column to be replaced is in primary array block $10_3$, corresponding to a block select code of 011.000 (see Table 1), fuses 62 corresponding to block select lines BZ5, BZ2, BZ1, BZ0 would be opened. As a result, nodes MH and ML will both be high, allowing the selection of redundant column $35_0$, only if the column address corresponds to primary array block 1031 in which case lines BZ3 and BZ4 are both at a high level.

In the event that a column address received by memory 1 corresponds to the block and column address programmed by fuses 62 in redundant column decoder $36_0$, and that the row address received by memory 1 is one of those associated with the half-array served by redundant column 350 (such that line ISELC presented to NOR gate 72 is low), all inputs to NAND gate 74 are at high logic levels. NAND gate 74 thus presents a high logic level on line $RCOLT_0$ and a low logic level on line $RCOLC_0$, turning on pass gates 46T, 46C for redundant column $35_0$, and enabling access to the memory cell 40 therein corresponding to the received row address.

The programming of fuses 51, 62 in redundant column decoder $36_0$ thus determines the column to be replaced by its associated redundant column 350. Since each of redundant column decoders 36 is similarly constructed, in this example of memory 1, up to eight redundant columns 35 in each half-array of memory 1 may be programmed to replace a column, regardless of the primary array block 10 in which the column to be replaced is located. As a result, the column redundancy architecture provided by the present invention allows for flexibility in replacement of columns, and thus provides a high level of repairability for relatively few columns.

This construction of redundant column decoder 36 is particularly advantageous over prior redundant decoders, both for rows and for columns. Conventional redundancy decoders included an inverter circuit, such as enabling circuits 55 described hereinabove, for each of the true and complement address pairs in the decoder, and also includes an enabling circuit such as circuit 55; in such conventional decoders, a logic gate such as a NAND received an input from each of the true/complement address lines, and also from the enabling circuit itself. In contrast, pass gates 61 are controlled by the enabling circuits 55, so that an input of the output logic gate (i.e., NANDs 70, 74) need not be connected to an enabling circuit. This removes one of the series devices out of the internal NAND stack, improving its switching speed.

Furthermore, redundant column decoder 36 according to this embodiment of the invention also presents a reduced, and more balanced, load to the true and complement address lines. For example, if redundancy is not enabled, all pass gates 61 are turned off, such that the true and complement address lines have only the junction capacitance of turned-off transistors as loads; in prior decoders, one of the true/complement address line pair would see not only a junction capacitance, but also a conducting gate capacitance of the pass gate plus the gate capacitance of the logic gate downstream, such that its load is greater than, and unbalanced from, its complementary paired line. Accordingly, the performance of memory 1 is improved, particularly in the unrepaired state, by way of the redundancy decoders therein.

Redundant column decoder 36 also may be implemented with fewer transistors than conventional redundant decoders. While such implementation is achieved at the cost of more fuses, it is contemplated that the layout area required for redundant column decoder 36 according to the present invention will be reduced from that of conventional decoders in most applications. Furthermore, even though more fuses are necessary according to this embodiment of the invention, the worst case number of fuses blown in each case will be the same and accordingly no test time penalty is incurred according to the present invention.

It is of course to be understood that redundant row decoders may similarly be constructed as redundant column decoders 36 according to the present invention, in the case where redundant rows are provided. In addition, as is evident from the above description, the redundancy decoder scheme according to this embodiment of the invention may be utilized with true/complement address line pairs, as well as with predecoded select lines (as in the case of block select $50_0$).

As noted hereinabove, two sense/write circuits 23 are available to redundant columns 35 in any access (four redundant columns 35 in each half-array assigned to each of sense/write circuits 23). This allows two redundant column decoders 36 in the same half-array to be programmed with the same column address, allowing access of two of redundant columns 35 in the same access, as the present invention allows selection of which input/output terminal DQ that each of redundant sense/write circuits 23 is to be assigned, for each programmed redundant column decoder. This is accomplished by way of redundant multiplexers 39, an example of one of which is shown in FIG. 6.

Redundant multiplexer $39a_0$ in FIG. 6 is one of the redundant multiplexers 39a in redundant multiplexer block 38a of FIGS. 1 and 2. Accordingly, redundant multiplexer $39a_0$ is associated with redundant sense/write circuit $23_1$ (and not with redundant sense/write circuit $23_0$), and with those redundant columns 35 which are sensed, or written to, by redundant sense/write circuit $23_1$. Accordingly, redundant multiplexer $39a_0$ of FIG. 6 receives, as inputs, redundant column select lines $RCOLT_0$ through $RCOLT_3$ from redundant column decoders $36_0$ through $36_3$ in redundant column select block 34a, and also redundant column select lines $RCOLT_{12}$ through $RCOLT_{15}$ from redundant column decoders $36_{12}$ through $36_{15}$ in redundant column select block 34b.

Each of the redundant column select lines RCOLT are received at the gate of an associated n-channel transistor 79, which has its drain connected to an associated fuse 78, and which has its source connected to ground. As discussed hereinabove, the redundant column select line RCOLT is driven to a high logic level by its associated redundant column decoder 36 when its associated redundant column 35 is selected by the column address (and one bit of the row address, in this example). Each of fuses 78 are connected between the drain of its associated transistor 79 and node 77. P-channel pull-up transistor 76 has its source/drain path connected between node 77 and the $V_{cc}$ power supply, and has its gate biased to ground; transistor 76 is preferably a relatively small transistor so that excessive DC current is not drawn therethrough when node 77 is pulled low by one of transistors 79, while still being capable of pulling node 77 high if it is not pulled low by any of transistors 79. The state of node 77 is communicated, via inverters 81, 83, as a signal on line $RSEL1_0$.

As will be discussed in further detail hereinbelow, line $RSEL1_0$ enables selection, when at a low logic level, of the redundant data from redundant sense/write circuit $23_1$ to be applied to input/output terminal $DQ_0$. In addition, line $RSEL1_0$ is connected to the gates of p-channel transistors in pass gates 80T, 80C, while its complement from the output of inverter 81 is connected to the gates of the n-channel transistors in pass gates 80T, 80C. Accordingly, a low logic level at node 77 will also cause coupling of input data lines $DT_0$, $DC_0$ from input/output terminal $DQ_0$ to redundant input data lines $RDT_1$, $RDC_1$ connected to the write circuitry 54 of redundant sense/write circuit $23_1$.

In operation, if redundancy is enabled by the opening of fuses in redundant column decoders 36, the selection of the input/output terminal DQ that each selected redundant column 35 is to be associated with is made by opening selected fuses 78 in the redundant multiplexers 39. In this example, when redundancy is enabled in the event of detection of a primary array column to be replaced, the test program must determine the association between each redundant column 35 to be used and the input/output terminal DQ to which it is to be associated for the replaced address. For each redundant column 35 that is to be accessed, its fuses 78 are opened in each redundant multiplexer 39 associated with input/output terminals with which the redundant column 35 is not to communicate; in the redundant multiplexer 39 associated with its input/output terminal, the fuse 78 for the redundant column 35 is left intact. Upon completion of the programming of redundant multiplexers 39, for each redundant column 35 that is to be accessed, one and only one of its fuses 78 is left intact, namely the fuse 78 in the redundant multiplexer 39 associated with the operative input/output terminal DQ. It should be noted that a redundant multiplexer 39 may have more than one of its fuses 78 left intact, as multiple ones of redundant columns 35 (corresponding to different column address values, of course) may be associated with the same input/output terminal DQ. For example, if the redundant columns 35 to be in communication with input/output terminal $DQ_0$ when selected are $35_2$ and $35_{12}$, fuses $78_0$, $78_1$, $78_3$, $78_5$, $78_6$, $78_7$ in redundant multiplexer $39a_0$ are all opened, and fuses $78_2$ and $78_4$ are left intact. Corresponding fuses $78_2$ and $78_4$ in the other redundant multiplexers 39a are opened, as redundant columns $35_2$ and $35_{12}$ never be in communication with any of the input/output terminals DQ other than terminal $DQ_0$.

Prior to the completion of the decoding of the column address by redundant column decoders 36, all lines RCOLT are at low logic levels. This causes node 77 to remain at a high level via transistor 76, such that line RSEL10 at the output of redundant multiplexer $39a_0$ is pulled to a high level via inverters 81, 83. If the column address decoded by redundant column decoders 36 does not correspond to any of the redundant columns 35 for which the corresponding fuses 78 remain intact, node 77 will not be pulled low via a combination of a transistor 79 and an intact fuse 78. If, however, the column address decoded by redundant column decoders 36 matches that of a redundant column 35 for which its corresponding fuse 78 is intact, the turning on of the associated transistor 79 will pull node 77 low through the intact fuse 78. A low logic level will then be driven on line $RSEL1_0$, connecting redundant sense/write circuit 23, to input/output terminal $DQ_0$, for both read and write operations.

The use of redundant multiplexers 39 according to this embodiment of the invention thus provides a great degree of flexibility in the utilization of redundant columns 35. Any one of the redundant columns 35 may be mapped to any one of the available input/output terminals DQ by way of a relatively simple algorithm according to the present invention. Redundant multiplexers 39 provide such mapping with relatively few transistors, minimal loading on the data lines, and little, if any, performance degradation in accessing a redundant location relative to a primary memory cell. Conventional mapping circuits have required significantly more transistors than according to the present invention, thus presenting relatively high load to the data lines, often resulting in an access time differential between redundant and primary memory cells.

Referring now to FIG. 7, an output multiplexer $84_k$ located within input/output circuitry 20 and which is controlled by the output of the redundant multiplexers $39_{ak}$, $39_{bk}$ by lines $RSEL0_k$, $RSEL1_k$ generated as described hereinabove will now be described in detail. As shown in FIG. 7, output multiplexer $84_k$ is connected to an associated one of data bus conductors $DBUS_k$ in data bus 22, as are the appropriate ones of data drivers 15 associated with the primary array blocks 10. In this embodiment of the invention, the primary column to be replaced by one of the redundant columns 35 is not physically disabled; instead, output multiplexers 84 merely select whether data bus conductor $DBUS_k$ or the output of a redundant sense/write circuit 23 is to be placed in communication with the associated input/output terminal $DQ_k$.

Included within output multiplexer $84k$ is pass gate 88 formed of n-channel and p-channel transistors with their source/drain paths connected in parallel between data bus conductor $DBUS_K$ and node $95_k$. Node $95_k$ is connected to output driver $82_k$, which drives input/output terminal $DQ_k$ in the conventional manner. While any conventional output driver circuit may be used as output driver $82_k$, a preferred output driver is described in copending application Ser. No. 809,387, filed Dec. 17, 1991, assigned to SGS-Thomson Microelectronics, Inc., and incorporated herein by this reference.

Also connected to node $95_k$ are pass gates $90_0$, $90_1$, each formed of n-channel and p-channel transistors with their source/drain paths connected in parallel between node $95_k$ and lines $RSNT_0$, $RSNT_1$, respectively. As described hereinabove, lines RSNT are the true data state lines presented by redundant sense/write circuits 23 responsive to the data state sensed thereby.

Signals on lines $RSEL0_K$ and $RSEL1_K$ control which of pass gates 88, $90_0$, or $90_1$ is conductive for a read operation. Line $RSEL0_K$ is connected to the gate of the p-channel transistor in pass gate $90_0$, to an input of NAND gate 86 and, via inverter $91_0$, to the gate of the n-channel transistor in pass gate $90_0$. Similarly, line $RSEL1_k$ is connected to the gate of the p-channel transistor in pass gate $90_1$, to an input of NAND gate 86 and, via inverter $91_1$, to the gate of the n-channel transistor in pass gate $90_1$. The output of NAND gate is coupled to the gate of the p-channel transistor in pass gate 88, and is coupled to the gate of the n-channel transistor in pass gate 88 via inverter 89.

In operation, if redundancy is not enabled, or if redundancy is enabled but the column address does not match that for which a redundant column 35 associated with input/output terminal $DQ_k$ is selected, both of lines $RSEL0_k$ and $RSEL1_K$ will be at a high logic levels. Both of pass gates $90_0$, $90_1$ will be off, and pass gate 88 will be on, such that data bus conductor DBUSK is connected to node $95_k$, to the exclusion of redundant data lines RSNT. In a read operation, output driver 82k will thus drive its input/output terminal $DQ_k$ to the data state corresponding to that of data bus conductor $DBUS_k$, as driven by the selected one of primary array data drivers 15.

In the event that redundancy is enabled, however, and the column address received by memory 1 corresponds to one of the redundant columns 35 which is to be associated with input/output terminal $DQ_k$, as described hereinabove the appropriate redundant multiplexer $39a_k$, $39b_k$ will drive its corresponding line $RSEL0_k$ or $RSEL1_k$ to a low logic level. This will cause the output of NAND gate 86 to go to a high logic level, turning off pass gate 88 and isolating node $95_k$ from data bus conductor $DBUS_K$ so that the data state driven thereupon by the data driver 15 associated with the primary column to be replaced is ignored. The one of pass gates 90 associated with the one of lines $RSEL_k$ that is driven low will be turned on, so that the data line RSNT from the associated redundant sense/write circuit 23 will be connected to node $95_k$. Output driver $82_k$ Will thus present a logic level corresponding to the selected memory cell 40 in the redundant column 35 that has replaced the failed primary column.

As noted hereinabove, coupling of the redundant input data lines RD for the selected redundant sense/write circuit 23 is accomplished within redundant multiplexers 39. Since the writing of a data state to the memory cells in the replaced column is irrelevant, as the replaced column is ignored by the operation of output multiplexers 84, no disconnection from the primary input data bus is required. The chip area required for implementation of memory 1 according to this embodiment of the invention is thus relatively efficient, as column disconnect fuses are not necessary.

One of output multiplexers 84 is associated with each of input/output terminals DQ in memory 1; in this example, therefore, eight such output multiplexers are provided. Of course, if differential data buses are provided, each of output multiplexers 84 would necessarily have to be duplicated so that multiplexing of the primary and redundant data is accomplished for the differential input to the output drivers 82. Another example of a data bus conductor scheme with which output multiplexers may be used is described in copending application Ser. No. 809,733, filed Dec. 17, 1991, assigned to SGS-Thomson Microelectronics, Inc., and incorporated herein by this reference. Other conventional data communication schemes may, of course, also be utilized in connection with the present invention.

Figure 8:
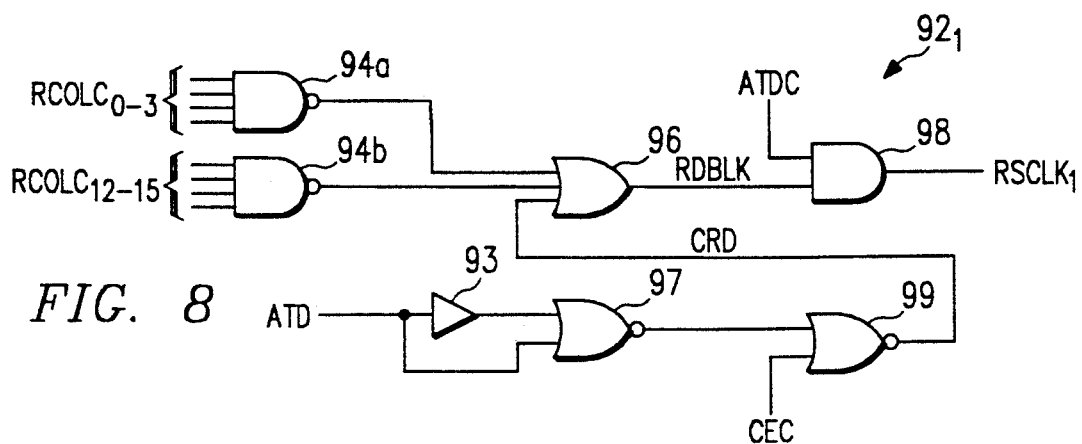
FIG. 8 is an electrical diagram, in schematic form, of a portion of the control circuitry in the architecture of FIG. 2.

Referring now to FIG. 8, the construction and operation redundancy control circuit $92_1$, for controlling the operation of redundant sense/write circuit $23_1$ will now be described; of course, a similarly constructed redundant control circuit $92_0$ is provided within memory 1 for controlling redundant sense/write circuit $23_0$. Redundancy control circuits 92 controls the operation of certain timing signals within memory 1 for performing the redundant column access, particularly the timing of sense amplifiers 48 in redundant sense/write circuits 23 by way of redundant sense clock RSCLK (see FIG. 4).

The incorporation of redundant elements, particularly redundant columns, into conventional memories generally results in slower access times for the memories. This is due to the conventional arrangement in which an additional level of decoding is provided for determining whether or not the received address matches that for which a redundant element is to be enabled. Since the specified access time depends on the worst case access, and thus since the access of redundant elements is delayed from that of primary elements, the time delay required for additional decoding for redundant elements directly impacts specified device performance.

In this embodiment of the present invention, however, the additional delay required for read accesses to redundant columns 35 is minimized, or even eliminated, by way of the control of the redundant sense/write circuits 23 by control circuits 92. Control circuit $92_1$, for example, includes NAND gate 94a which receives redundant column select lines $RCOLC_0$ through $RCOLC_3$ at its inputs, and NAND gate 94b which receives redundant column select lines $RCOLC_{12}$ through $RCOLC_{15}$ at its inputs; as described hereinabove, redundant column select lines $RCOLC_0$ through $RCOLC_3$ and $RCOLC_{12}$ through $RCOLC_{15}$ when low, indicate selection of their redundant column 35, each of which are associated with redundant sense/write circuit $23_1$. The outputs of NAND gates 94a, 94b are received at inputs of OR gate 96, as is control line CRD. One input of AND gate 98 receives the output of OR gate 96 on line RDBLK, and the other input of AND gate 98 receives line ATDC from ATD circuit 25; line ATDC indicates an address transition by way of a low logic level pulse. The output of AND gate 98 drives line $RSCLK_1$, which is the clock controlling the sensing of data by sense amplifier 48 in redundant sense/write circuit $23_1$.

Line ATD from ATD circuit 25 is also received by one input of NOR gate 97, and by delay gate 93; the output of delay gate 93 is coupled to the other input of NOR gate 97. The output of NOR gate 97 is coupled to one input of NOR gate 99, which receives line CEC at its other input; line CEC indicates, with a low logic level, that memory 1 is enabled. The output of NOR gate 99 drives line CRD, and as such is coupled to an input of OR gate 96.

It should be noted that lines ATD, ATDC may indicate the detection of transitions not only at address terminals of memory 1, but also at control terminals such as those receiving chip enable, read/write select, output enable, and other similar signals. In addition, it may be preferred, particularly where the chip size of memory 1 is large, that multiple ATD circuits 25 be used for various regions of the chip (e.g., top and bottom), with delays inserted as necessary so that the timing of each, as received by control circuit 92 for example, is consistent with the other. If multiple ATD circuits are used, of course, lines ATD, ATDC would be generated as the logical OR (or NOR, as the case may be) of the output thereof.

The operation of control circuit 92, as well as the operation of memory 1 according to this embodiment generally, will now be described with reference to FIG. 9, for the example of a read operation to a memory cell having a column address corresponding to that for which redundant column $35_2$ is programmed, it is contemplated that the operation of memory 1 in performing other cycles, such as write operations to redundant columns 35 and other conventional types of memory accesses, will be apparent to one of ordinary skill in the art having reference to the above description, particularly as explained hereinbelow relative to the exemplary operation shown in FIG. 9. Reference should also be made to all foregoing FIGS. 1 through 8 during the following description of the operation of memory 1.

Figure 9:
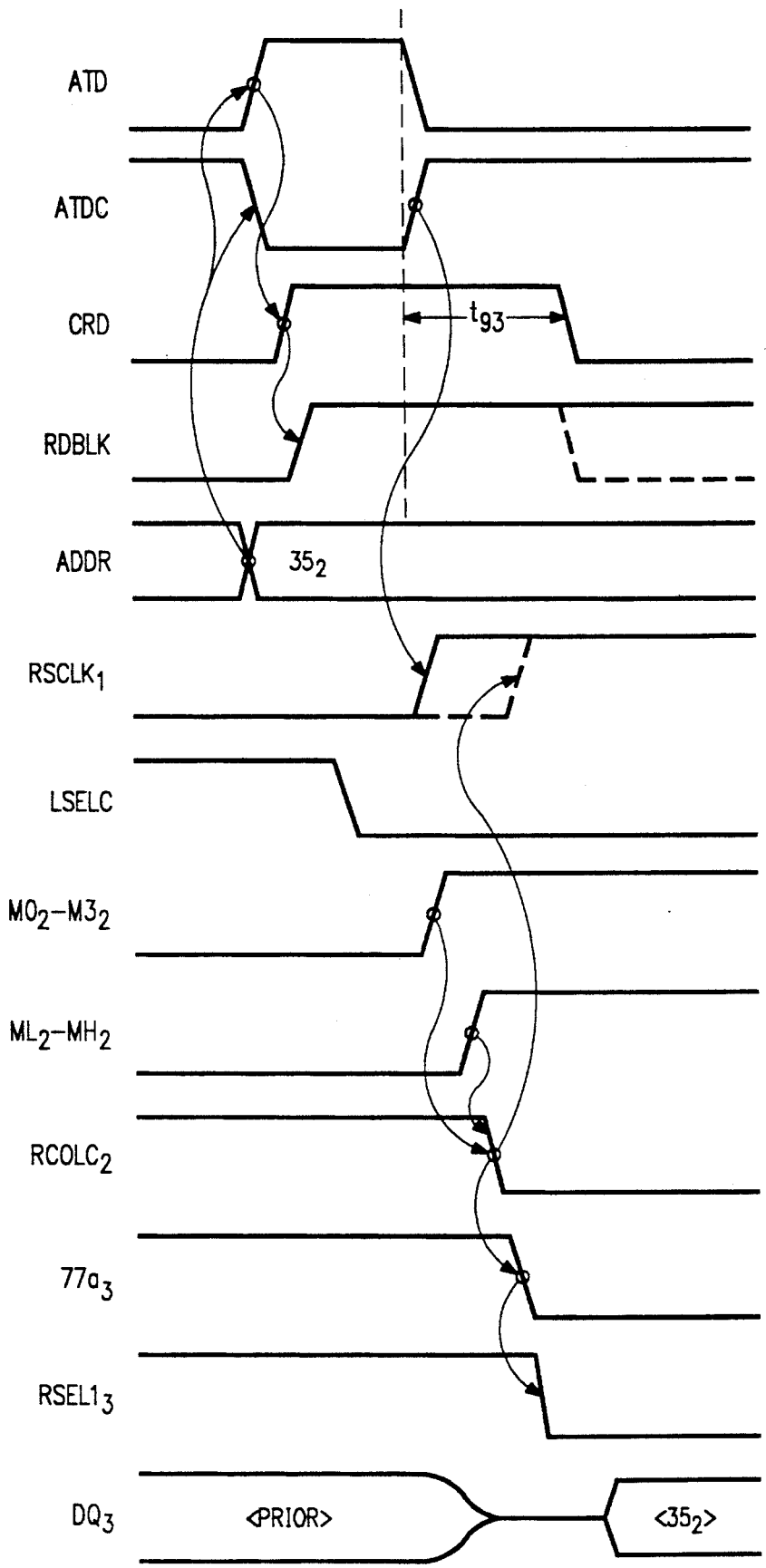
FIG. 9 is a timing diagram illustrating the operation of the memory of FIG. 1 for a read from a redundant column.

In operation, this example of a memory cycle begins with a new address received at the address terminals of memory 1 (shown on line ADDR of FIG. 9). Responsive to detecting a transition at one or more of address terminals A, ATD circuit 25 issues a high level pulse on line ATD and a low level pulse on line ATDC. The low logic level on line ATDC also causes line $RSCLK_1$ at the output of AND gate 98 to remain at a low logic level (assuming that the prior cycle was not an access to a redundant column 35 served by redundant sense/write circuit $23_1$; if it were, line $RSCLK_1$ would be driven low at this time).

Responsive to the high logic level on line ATD, the output of NOR gate 97 is driven low and, assuming memory 1 is enabled (i.e. line CEC low), NOR gate 99 generates a high logic level on line CRD. This causes OR gate 96 to drive line RDBLK high as presented to AND gate 98, and maintain line RDBLK high until the delay time of delay gate 93 ($t_{93}$ in FIG. 9) elapses after the end of the ATD pulse.

At the time that line CRD goes high, however, the propagation of decoded column address signals through redundant column decoders 36 has not yet completed (in particular, signal RDBLK has not yet been asserted based on the selected column address). Because line CRD forces line RDBLK high during its duration, though, the end of the ATD pulse indicated on line ATDC will initiate the operation of sense amplifier 48 in redundant sense/write circuit $23_1$ by driving line $RSCLK_1$ high; redundant sense/write circuit $23_0$ will be similarly enabled by its control circuit $92_0$ at this time. Due to the combination of decoding delays, particularly in redundant column decoders 36, and the summing performed by NANDs 94a, 94b and OR 96, the forcing high of line RDBLK according to this embodiment of the invention ensures that both redundant sense amplifiers 48 will turn on well prior to the generation of the signal on line RDBLK based solely on a matching column address value, other control signals may also be similarly generated, such as for controlling equilibration in redundant sense/write circuits 23. Because of this early forcing high of line RDBLK, redundant sense/write circuits 23 turn on at the same time as the primary sense/write circuits 13 and, in the event a redundant column 35 is selected, the one of redundant sense/write circuits 23 associated therewith will remain on. This operation helps eliminate any access time differential between accesses of memory cells in redundant columns 35 and those in primary array blocks 10.

In the event that none of the redundant columns 35 associated with redundant sense/write circuit $23_1$ are selected, none of redundant column select lines $RCOLC_0$ through $RCOLC_3$ and $RCOLC_{12}$ through $RCOLC_{15}$ are driven low, and thus the outputs of NAND gates 94a, 94b remain low. Upon the end of delay time $t_{93}$ after the ATD pulses are completed, line CRD returns low and, if both NAND gates 94a and 94b are low at their output, line RDBLK will return low as will line $RSCLK_1$. Sense amplifier 48 in redundant sense/write circuit $23_1$ is thus turned off if none of its redundant columns 35 are selected.

In the example of FIG. 9, however, the address presented to memory 1 is that of the primary column to be replaced by redundant column $35_2$. Accordingly, line LSELC is driven low since the most significant row address bit is indicating the half-array corresponding to redundant column $35_2$. Upon decoding of the column address by column select $52_2$ in redundant column decode $36_2$, and since a match exists, all of nodes $M0_2$ through $M3_3$ therein will go to a high logic level. In addition, since the block address also matches, nodes $ML_2$ and $MH_2$ in block select $50_2$ in redundant column decoder $36_2$ will also go to a high logic level. As a result of the match, redundant column decoder $36_2$ will issue a low logic level on line $RCOLC_2$ and a high logic level on line $RCOLT_2$, turning on the associated pass gates 46T, 46C, and coupling the bit lines in redundant column $35_2$ to bus 21 and in turn to redundant sense/write circuit $23_1$, which is associated with redundant column $35_2$.

Delay time $t_{93}$ of delay gate 93 is selected so that it does not elapse until such time as redundant column decoders 36 have been able to drive their redundant column select lines RCOLT, RCOLC if the address matches. Accordingly, referring to FIG. 9, in this example line $RCOLC_2$ is driven low by its redundant column decoder $36_2$ prior to the end of the high level pulse on line CRD. As such, line RDBLK at the output of OR gate remains high as does line $RSCLK_1$ at the output of AND gate 98, maintaining sense amplifier 48 on in redundant sense/write circuit $23_1$ and allowing it to sense the state of the selected memory cell 40 in redundant column $35_2$.

The logic low level on line $RCOLC_2$ and high level on line $RCOLT_2$ resulting from the address match has also been communicated to redundant multiplexers 39a. In this example, redundant column $35_2$ has been assigned to input/output terminal $DQ_3$, by opening all fuses $78_3$ associated with line $RCOLT_2$ in redundant multiplexers $39a_0$ through $39a_2$ and $39a_4$ through $39a_7$, and leaving intact fuse $78_3$ in redundant multiplexer $39a_3$, which is associated with terminal $DQ_3$. Node 77 in redundant multiplexer $39a_3$ thus is driven low by line $RCOLT_2$, which in turn drives line $RSEL1_3$ low, connecting redundant sense/write circuit $23_1$ to the output driver associated with input/output terminal $DQ_3$. At the completion of the access time, the contents of the selected memory cell 40 in redundant column $35_2$ thus appears at terminal $DQ_3$, completing the access.

As a result of redundant control circuits 92 according to the present invention, the access time of a memory cell 40 in a redundant column 35 is thus not dependent upon the decoding time of redundant column decoders 36, since the sense amplifiers 48 in redundant sense/write circuits 23 are enabled in each access prior to the completion of the decoding. For example, as shown in FIG. 9, the transition of control signal RSCLK, which would occur if it depended upon the redundant column address decoding, and thus upon redundant column select line $RCOLC_2$ is illustrated by dashed lines. Furthermore, if no match occurs, sense amplifiers 48 are quickly turned off (e.g., after about 2 nsec), minimizing the power dissipation resulting from the turning on of the redundant sense/write circuits 23; in addition, since no differential voltage is present on redundant bit lines RBL for those redundant columns 35 that are not selected, this rapid turning off of redundant sense/write circuits 23 will eliminate the risk of oscillation or crowbar conditions. Accordingly, the improved access time is achieved with minimal power dissipation penalty.

Similar techniques can be used to generate other signals within the redundancy scheme prior to decoding, thus reducing access time degradation as a result of the redundancy. For example, if the row lines in memory 1 are configured as a global row line driven by row decoders 24a, 24b, which is connected by way of a pass transistor to local row lines for each primary array block 10 and the associated redundant array block 30, it is preferred that the local row line for redundant array block 30 be generated regardless of whether or not a redundant access will occur. This eliminates the need for the column decoding to be completed prior to enabling of a row line in the redundant array block; instead, all memory cells 40 in the redundant array block 30 are connected to their bit lines prior to the time that pass gates 46T, 46C, are enabled for the selected redundant column 35. It is believed that the additional power dissipation penalty resulting from enabling redundant array block 30 in each access is outweighed by the improved access time, in many cases. In particular, any additional power dissipation penalty so resulting is minimized according to the present invention, as the number of redundant columns 35 can be kept quite small (e.g., eight columns per half-array) due to the flexibility provided in this embodiment of the invention relative to mapping of redundant columns 35 to any column address value and to any input/output terminal DQ.

The column redundancy architecture described herein also thus provides many other significant advantages. In particular, the present invention provides a redundancy scheme of high efficiency, as it allows each redundant column to be assigned to any primary array block with which it has a common word line, and to be assigned to any one of the input/output terminals. This allows the redundant columns to be implemented in relatively little chip area, while still providing high repairability yield.

Furthermore, the particular redundant column decoder circuits described hereinabove also provide high efficiency of implementation, as fewer transistors are necessary in the decoder circuitry. The decoder circuits also provide balanced load on the address lines, thus further improving the performance in the decoding of addresses, especially if redundancy is not enabled.

While the invention has been described herein relative to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

We claim:

1. An integrated circuit, comprising:
   a plurality of memory cells, arranged in rows and columns, and grouped into a plurality of primary array blocks according to a plurality of column address ranges;
   address terminals for receiving a row address and a column address;
   a first output terminal for presenting data from said memory cells;
   row selecting means for selecting a row of said memory cells in one of said primary array blocks responsive to the row address and to a block portion of said column address;
   column selecting means for selecting a memory cell in said selected row responsive to a column portion of said column address;
   primary sensing means for sensing the data state of the memory cell selected by said column selecting means, and having an output for presenting the sensed data state;
   a plurality of redundant memory cells, arranged in a redundant column;
   a first redundant column decoder, coupled to said address terminals, for storing a column address responsive to which said redundant column is to be accessed instead of a memory cell in said plurality of memory cells, said stored column address corresponding to both the block portion and the column portion of the column address, and for comparing the column address received at said address terminals with the stored column address, said first redundant column decoder having an output for presenting a signal indicating the result of the comparing of the received column address with the stored column address, said signal coupled to said redundant column for selecting a redundant memory cell therein responsive to the received column address matching the stored column address;
   first redundant sensing means for sensing the data state of the redundant memory cell selected by the redundant column decoder, and having an output for presenting the sensed data state; and
   a first output multiplexer for selectively coupling the output of said primary sensing means or the output of said first redundant sensing means to said first output terminal responsive to the output of said first redundant column decoder indicating a match.

2. The integrated circuit of claim 1, further comprising:
   a second output terminal for presenting data from said memory cells; and
   a second output multiplexer for selectively coupling the output of said primary sensing means or the output of said first redundant sensing means to said second output terminal responsive to the output of said first redundant column decoder indicating a match.

3. The integrated circuit of claim 2, further comprising:
   first and second redundant multiplexers for selectively coupling the output of said first redundant sensing means to said first output terminal and said second output terminal, respectively, responsive to the output of said first redundant column decoder indicating a match.

4. The integrated circuit of claim 3, wherein said first and second redundant multiplexers each comprise a fuse, said fuse indicating whether or not its associated redundant multiplexer is responsive to the output of said first redundant column decoder.

5. The integrated circuit of claim 1, wherein said first redundant column decoder comprises:
   a plurality of fuses, wherein the opened and intact state of said fuses corresponds to the stored column address.

6. The integrated circuit of claim 1, wherein said plurality of redundant memory cells are arranged into a plurality of redundant columns including first and second redundant columns;
   wherein said first redundant column decoder is coupled to said first redundant column;
   and further comprising;
   a second redundant column decoder coupled to said address terminals, for storing a column address responsive to which a redundant memory cell in the second redundant column is to be accessed instead of a memory cell in said plurality of memory cells, said stored column address corresponding to both the block portion and the column portion of the column address, and for comparing the column address received at said address terminals with its stored column address, said second redundant column decoder having an output for presenting a signal indicating the result of the comparing of the received column address with the stored column address, said signal coupled to said second redundant column for selecting the redundant memory cell therein responsive to the received column address matching the stored column address.

7. The integrated circuit of claim 6, further comprising:
   second redundant sensing means for sensing the data state of the redundant memory cell selected by the second redundant column decoder, and having an output for presenting the sensed data state;
   wherein said first redundant sensing means is for sensing the data state of the redundant memory cell selected by the first redundant column decoder.

8. The integrated circuit of claim 7, wherein said first output multiplexer is also coupled to the output of said second redundant sensing means, for coupling the output of said second redundant sensing means to said first output terminal responsive to the output of said second redundant column decoder.

9. The integrated circuit of claim 8, further comprising:
   a second output terminal for presenting data from said memory cells; and
   a second output multiplexer for selectively coupling the output of said primary sensing means, the output of said first redundant sensing means, or the output of said second redundant sensing means to said second output terminal responsive to the states of the outputs of said first and second redundant column decoders; and
   first and second redundant multiplexers for selectively coupling the output of said first redundant sensing means to said first output terminal or said second output terminal, respectively, responsive to the output of said first redundant column decoder indicating a match; and third and fourth redundant multiplexers for selectively coupling the output of said second redundant sensing means to said first output terminal or said second output terminal, respectively, responsive to the output of said second redundant column decoder indicating a match.

10. The integrated circuit of claim 9, wherein said first, second, third and fourth redundant multiplexers each comprise first and second fuses for selecting to which of said first and second output terminals the output of its associated redundant sensing means is to be coupled.

11. A column redundancy circuit for a memory having a plurality of primary memory cells arranged in rows and columns, said memory having a row decoder for selecting a row of said memory cells according to a row address, a column decoder for selecting first and second memory cells in the selected row according to a column address, and first and second sense amplifiers for communicating the data state of the first and second memory cells, respectively, to first and second lines of an internal data bus corresponding to first and second output terminals, comprising:

a plurality of redundant memory cells, arranged in a first redundant column;

a first redundant sense amplifier, having an output for presenting the data state of a redundant memory cell coupled thereto;

a first redundant column decoder for comparing a received column address with a stored column address, and for coupling a redundant memory cell in said first redundant column to said first redundant sense amplifier responsive to the received column address matching the stored column address;

first and second redundant multiplexers, each coupled to the output of said first redundant sense amplifier, for selectively coupling the output of said first redundant sense amplifier to said first and second output terminals, respectively, responsive to said first redundant column decoder indicating a match.

12. The circuit of claim 11, wherein said first and second redundant multiplexers each have outputs for presenting a control signal indicating selection of its associated output terminal for presentation of the output of the first redundant sense amplifier;

and further comprising:

a first output multiplexer, coupled to the first line of said internal data bus, to the first redundant sense amplifier to the first redundant multiplexer, and to the first output terminal, for coupling said first line of said internal data bus to the first output terminal responsive to said first redundant column decoder not indicating a match, and for coupling the output of said first redundant sense amplifier to said first output terminal responsive to the control signal from said first redundant multiplexer indicating selection of said first output terminal; and a second output multiplexer, coupled to the second line of said internal data bus, to the first redundant sense amplifier to the second redundant multiplexer, and to the second output terminal, for coupling said second line of said internal data bus to the second output terminal responsive to said first redundant column decoder not indicating a match, and for coupling the output of said first redundant sense amplifier to said second output terminal responsive to the control signal from said second redundant multiplexer indicating selection of said second output terminal.

13. The circuit of claim 12, wherein said plurality of redundant memory cells are arranged in first and second redundant columns;

further comprising:

a second redundant column decoder for comparing a received column with a stored column address, and for coupling a redundant memory cell in said second redundant column to said first redundant sense amplifier responsive to the received column address matching the stored column address;

and wherein said first and second redundant multiplexers couple the output of said first redundant sense amplifier to said first and second output terminals, respectively, also responsive to said second redundant column decoder indicating a match.

14. The circuit of claim 13, wherein said first redundant multiplexer comprises:

first means for disabling the coupling of the output of the first redundant sense amplifier from said first output terminal in the event of said first redundant column decoder indicating a match; and second means for disabling the coupling of the output of the first redundant sense amplifier from said first output terminal in the event of said second redundant column decoder indicating a match.

15. The circuit of claim 14, wherein said first and second disabling means each comprise a fuse.

16. The circuit of claim 11, wherein said memory also has first and second input terminals for receiving data to be written into a selected memory cell in a write operation;

wherein said first redundant sense amplifier also includes circuitry for writing the selected redundant memory cell with input data;

and wherein each of said first and second redundant multiplexers are also coupled to said first and second input terminals, respectively, and is for selectively coupling said first redundant sense amplifier to said first and second input terminals, respectively, responsive to said first redundant column decoder indicating a match in the write operation.

17. The circuit of claim 16, wherein said first input terminal is the same terminal as said first output terminal;

and wherein said second input terminal is the same terminal as said second output terminal.

18. The circuit of claim 12, wherein said plurality of redundant memory cells are arranged in first and second redundant columns;

further comprising:

a second redundant sense amplifier, having an output for presenting the data state of a redundant memory cell coupled thereto; and a second redundant column decoder for comparing a received column address with a stored column address, and for coupling a redundant memory cell in said second redundant column to said second redundant sense amplifier responsive to the received column address matching the stored column address;

and wherein said first and second redundant multiplexers couple the outputs of said redundant sense amplifiers to said first and second output terminals, respectively, responsive to said redundant column decoders indicating a match, and responsive to the condition of fuses located within each of said first and second redundant multiplexers indicating whether said redundant multiplexers are to couple the output of said first or said second redundant sense amplifier to their associated output terminals.

19. The circuit of claim 18, wherein said first redundant multiplexer comprises:

first means for disabling the coupling of the output of the first redundant sense amplifier from said first output terminal in the event of said first redundant column decoder indicating a match; and second means for disabling the coupling of the output of the second redundant sense amplifier from said second output terminal in the event of said second redundant column decoder indicating a match.

20. The circuit of claim 19, wherein said first and second disabling means each comprise a fuse.

* * * * *